(12) United States Patent
Jang et al.

(10) Patent No.: US 11,901,397 B2
(45) Date of Patent: Feb. 13, 2024

(54) LED CHIP HAVING FAN-OUT STRUCTURE AND MANUFACTURING METHOD OF THE SAME

(71) Applicant: SEOUL VIOSYS CO., LTD., Ansan-si (KR)

(72) Inventors: Jong Min Jang, Ansan-si (KR); Chang Yeon Kim, Ansan-si (KR)

(73) Assignee: SEOUL VIOSYS CO., LTD., Ansan-si (KR)

(*) Notice: Subject to any disclaimer, the term of this patent is extended or adjusted under 35 U.S.C. 154(b) by 0 days.

(21) Appl. No.: 16/849,842

(22) Filed: Apr. 15, 2020

(65) Prior Publication Data
US 2020/0365648 A1 Nov. 19, 2020

Related U.S. Application Data

(60) Provisional application No. 62/869,979, filed on Jul. 2, 2019, provisional application No. 62/847,868, filed on May 14, 2019.

(51) Int. Cl.
*H01L 27/15* (2006.01)
*H01L 33/22* (2010.01)
(Continued)

(52) U.S. Cl.
CPC .......... *H01L 27/15* (2013.01); *H01L 33/0093* (2020.05); *H01L 33/0095* (2013.01);
(Continued)

(58) Field of Classification Search
CPC . H01L 27/15; H01L 33/0093; H01L 33/0095; H01L 33/22; H01L 33/38;
(Continued)

(56) References Cited

U.S. PATENT DOCUMENTS 5,696,389 A 12/1997 Ishikawa et al.
7,202,504 B2 4/2007 Ikeda et al.
(Continued)

FOREIGN PATENT DOCUMENTS

EP 2768033 8/2014
EP 3944315 A1 1/2022
(Continued)

OTHER PUBLICATIONS

International Search Report dated Aug. 26, 2020 in WO Patent Application No. PCT/KR2020/006187.
(Continued)

*Primary Examiner* — Su C Kim
(74) *Attorney, Agent, or Firm* — Oblon, McClelland, Maier & Neustadt, L.L.P.

(57) ABSTRACT

A light emitting package including a first LED sub-unit, a second LED sub-unit disposed on the first LED sub-unit, a third LED sub-unit disposed on the second LED sub-unit, a plurality of connection electrodes electrically connected to at least one of the first, second, and third LED sub-units, the connection electrodes having side surfaces and covering a side surface of at least one of the first, second, and third LED sub-units, a first passivation layer surrounding at least the side surfaces of the connection electrodes, an insulating layer having first and second opposed surfaces, with the first surface facing the LED sub-units, and a first electrode disposed on the first surface of the insulating layer and connected to at least one of the connection electrodes.

20 Claims, 18 Drawing Sheets

(51) Int. Cl.
*H01L 33/38* (2010.01)
*H01L 33/44* (2010.01)
*H01L 33/00* (2010.01)
*H01L 33/54* (2010.01)
*H01L 33/62* (2010.01)

(52) U.S. Cl.
CPC .............. *H01L 33/22* (2013.01); *H01L 33/38* (2013.01); *H01L 33/44* (2013.01); *H01L 33/54* (2013.01); *H01L 33/62* (2013.01); *H01L 2933/005* (2013.01); *H01L 2933/0016* (2013.01); *H01L 2933/0025* (2013.01); *H01L 2933/0066* (2013.01)

(58) Field of Classification Search
CPC ......... H01L 33/44; H01L 33/54; H01L 33/62; H01L 2933/0016; H01L 2933/0025; H01L 2933/005; H01L 2933/0066; H01L 33/08; H01L 33/486; H01L 25/0753
See application file for complete search history.

(56) References Cited

U.S. PATENT DOCUMENTS

| | | | |
|---|---|---|---|
| 8,952,416 | B2 | 2/2015 | Jeong |
| 9,006,764 | B2 | 4/2015 | Akimoto et al. |
| 10,937,924 | B2 | 3/2021 | Zou et al. |
| 11,282,981 | B2 | 3/2022 | Kim et al. |
| 11,322,488 | B2 | 5/2022 | Chang |
| 11,450,648 | B2 | 9/2022 | Jang et al. |
| 11,587,914 | B2 | 2/2023 | Jang et al. |
| 2003/0213967 | A1 | 11/2003 | Forrest et al. |
| 2006/0255343 | A1* | 11/2006 | Ogihara ................. H01L 24/24 257/82 |
| 2007/0069220 | A1 | 3/2007 | Ogihara |
| 2007/0170444 | A1 | 7/2007 | Cao |
| 2008/0251799 | A1 | 10/2008 | Ikezawa |
| 2008/0308819 | A1* | 12/2008 | Louwsma ............ H01L 27/322 257/E33.012 |
| 2009/0078955 | A1 | 3/2009 | Fan et al. |
| 2010/0051975 | A1 | 3/2010 | Suzuki et al. |
| 2011/0186876 | A1 | 8/2011 | Suzuki et al. |
| 2013/0161628 | A1 | 6/2013 | Suzuki et al. |
| 2014/0284633 | A1 | 9/2014 | Tsay et al. |
| 2016/0163765 | A1 | 6/2016 | Hu et al. |
| 2017/0033268 | A1 | 2/2017 | Lee et al. |
| 2017/0077367 | A1* | 3/2017 | Shimojuku ............ H01L 33/44 |
| 2017/0250316 | A1 | 8/2017 | Yeon et al. |
| 2017/0288093 | A1* | 10/2017 | Cha ....................... H01L 33/382 |
| 2017/0309678 | A1 | 10/2017 | Yang et al. |
| 2019/0006413 | A1 | 1/2019 | Jacob et al. |
| 2019/0006561 | A1 | 1/2019 | Chun-Hung et al. |
| 2020/0219858 | A1 | 7/2020 | Chang |
| 2020/0365648 | A1* | 11/2020 | Jang ....................... H01L 33/08 |

FOREIGN PATENT DOCUMENTS

| | | |
|---|---|---|
| JP | 2012033510 | 2/2012 |
| KR | 10-2015-0002113 A | 1/2015 |
| WO | 2018064805 | 4/2018 |
| WO | 2019004508 | 1/2019 |
| WO | 2019103566 A1 | 5/2019 |
| WO | 2020231108 A1 | 11/2020 |

OTHER PUBLICATIONS

Non-Final Office Action dated Dec. 21, 2020, in U.S. Appl. No. 16/848,914.
Non-Final Office Action dated Dec. 21, 2020, in U.S. Appl. No. 16/858,674.
Non-Final Office Action dated Oct. 6, 2021, in U.S. Appl. No. 16/852,522.
Non-Final Office Action dated Nov. 9, 2022, in U.S. Appl. No. 16/858,674.
Extended European Search Report dated Apr. 13, 2023, issued in European Patent Application No. 20805270.4.
Final Office Action dated Apr. 4, 2022, in U.S. Appl. No. 16/852,522.
Non-Final Office Action dated Jul. 21, 2022, in U.S. Appl. No. 16/858,674.
Extended European Search Report dated Apr. 25, 2023, issued in European Patent Application No. 20805420.5.
Extended European Search Report dated May 2, 2023, issued in European Patent Application No. 20804781.1.
Extended European Search Report dated Apr. 28, 2023, issued in European Patent Application No. 20804981.7.
Notice of Allowance dated Dec. 21, 2022, in U.S. Appl. No. 16/855,522.
Non-Final Office Action dated Dec. 13, 2022, in U.S. Appl. No. 16/848,914.
Non-Final Office Action dated Sep. 1, 2022, in U.S. Appl. No. 16/852,522.
Final Office Action dated Aug. 3, 2022, in U.S. Appl. No. 16/848,914.
Notice of Allowance dated May 1, 2023, in U.S. Appl. No. 16/858,674.

* cited by examiner

LED CHIP HAVING FAN-OUT STRUCTURE AND MANUFACTURING METHOD OF THE SAME

CROSS-REFERENCE TO RELATED APPLICATIONS

This application claims the benefit of U.S. Provisional Application No. 62/847,868, filed on May 14, 2019, and U.S. Provisional Application No. 62/869,979, filed on Jul. 2, 2019, each of which is hereby incorporated by reference for all purposes as if fully set forth herein.

BACKGROUND

Field

Exemplary embodiments of the invention relate to a light emitting chip for a display and a manufacturing method of the same and, more specifically, to a micro light emitting chip having a stacked structure and a manufacturing method of the same.

Discussion of the Background

As an inorganic light source, light emitting diodes (LEDs) have been used in various technical fields, such as displays, vehicular lamps, general lighting, and the like. With advantages of long lifespan, low power consumption, and high response speed, light emitting diodes have been rapidly replacing an existing light source.

Light emitting diodes have been mainly used as backlight light sources in display apparatus. However, micro-LED displays have been recently developed that are capable of implementing an image directly using the light emitting diodes.

In general, a display apparatus implements various colors by using mixed colors of blue, green and, red light. The display apparatus includes pixels each having sub-pixels corresponding to blue, green, and red colors, and a color of a certain pixel may be determined based on the colors of the sub-pixels therein, and an image can be displayed through combination of the pixels.

Since LEDs can emit various colors depending upon its constituent materials, a display apparatus may typically have individual LED chips emitting blue, green, and red light arranged on a two-dimensional plane. However, when one LED chip is provided for each sub-pixel, the number of LED chips required to be mounted to form a display device becomes very large, e.g., over hundreds of thousands or millions, which may require a significant amount of time and complexity for the mounting process. Moreover, since the sub-pixels are arranged on the two-dimensional plane in a display apparatus, a relatively large area is required for one pixel including the sub-pixels for blue, green, and red light, and reducing the luminous area of each sub-pixel would deteriorate the brightness of the sub-pixels.

Moreover, micro-LEDs typically have a very small size with a surface area of about 10,000 square µm or less, and thus, various technical problems arise due to this small size. For example, an array of micro-LEDs is formed on a substrate, and the micro-LEDs may be singularized into each micro-LED chip by cutting the substrate. The individualized micro-LED chips may then be mounted on another substrate, such as a printed circuit board, during which various transferring technologies may be employed. However, during these transferring steps, handling of each micro-LED chip is generally difficult due to its small size and its vulnerable structure. Furthermore, electrodes formed on a target substrate, such as that of a display device, generally are spaced apart from each other at a pitch that corresponds to the pitch of the electrodes of conventional pixels having multiple sub-pixels arranged on a two-dimensional plane.

The above information disclosed in this Background section is only for understanding of the background of the inventive concepts, and, therefore, it may contain information that does not constitute prior art.

SUMMARY

Light emitting chips constructed according to the principles and some exemplary implementations of the invention are capable of protecting the light emitting stacked structures during various transferring processes.

Light emitting chips and a display using the same, e.g., micro-LEDs, constructed according to the principles and some exemplary implementations of the invention have a simplified structure that reduces the time for the mounting process during manufacture.

Light emitting packages, e.g., micro-LEDs, constructed according to the principles and some exemplary implementations of the invention are capable of being mounted on a conventional display device with enhanced internal structure that facilitates handling and transfer.

Light emitting packages, e.g., micro-LEDs, constructed according to the principles and some exemplary implementations of the invention have reinforced structure produced by not removing a substrate of a light emitting stacked structure, such as a growth substrate of one of the LED stacks.

Additional features of the inventive concepts will be set forth in the description which follows, and in part will be apparent from the description, or may be learned by practice of the inventive concepts.

A light emitting package according to an exemplary embodiment includes a first LED sub-unit, a second LED sub-unit disposed on the first LED sub-unit, a third LED sub-unit disposed on the second LED sub-unit, a plurality of connection electrodes electrically connected to at least one of the first, second, and third LED sub-units, the connection electrodes having side surfaces and covering a side surface of at least one of the first, second, and third LED sub-units, a first passivation layer surrounding at least the side surfaces of the connection electrodes, an insulating layer having first and second opposed surfaces, with the first surface facing the LED sub-units, and a first electrode disposed on the first surface of the insulating layer and connected to at least one of the connection electrodes.

The connection electrodes may overlap at least one of the first, second, and third LED sub-units.

The light emitting package may further include a substrate on which the first LED sub-unit is disposed, in which the substrate may be exposed by the first passivation layer.

The first passivation layer may be disposed between the connection electrodes.

The first electrode may include a plurality of contact electrodes, each of which is may correspond to one of the connection electrodes, the contact electrodes may be spaced apart from each other at a first pitch, and the connection electrodes may be spaced apart from each other at a second pitch, with the first pitch being greater than the second pitch.

The first LED sub-unit may longitudinally extend along a first direction, and the first electrode may extend away from the first LED sub-unit along the first direction.

The light emitting package may further include an auxiliary electrode formed on the second surface of the insulating layer, and a second passivation layer surrounding at least sides of the auxiliary electrode and being spaced apart from the first passivation layer.

The light emitting package may further include a substrate on which the first LED sub-unit may be disposed, the substrate having a top surface and side surfaces, an auxiliary electrode formed on the second surface of the insulating layer, and a second passivation layer surrounding at least sides of the auxiliary electrode, in which the first passivation layer may cover the top surface and side surfaces of the substrate.

The light emitting package may further include a substrate on which the first LED sub-unit is disposed, in which the first LED sub-unit may include a first LED light emitting stack, the second LED sub-unit may include a second LED light emitting stack, the third LED sub-unit may include a third LED light emitting stack, and the first, second, and third LED light emitting stacks may have successively smaller regions overlapping with the substrate, and at least one of the LED light emitting stacks may include a micro-LED having a surface area less than about 10,000 square μm.

The first passivation layer may include at least one of a black epoxy molding compound and a polyimide film, and the first passivation layer may cover an upper surface of the third LED sub-unit.

The light emitting package may further include a second passivation layer disposed between the third LED sub-unit and the connection electrodes.

At least one of the connection electrodes may cover a portion of a side surface and a portion of a top surface of the second passivation layer.

The first passivation layer may be disposed between the connection electrodes.

The first passivation layer may contact the second passivation layer between the connection electrodes.

The first passivation layer and the second passivation layer may include the same material.

The first electrode may include a plurality of contact electrodes, each of which may correspond to one of the connection electrodes, the contact electrodes may be spaced apart from each other at a first pitch, and the connection electrodes may be spaced apart from each other at a second pitch, with the first pitch being greater than the second pitch.

The light emitting package may further include a substrate on which the first LED sub-unit is disposed, in which an angle defined between a side surface of the second passivation layer and a top surface of the substrate may be less than about 80°.

The first passivation layer may expose a top surface of the substrate.

The light emitting package may further include an auxiliary electrode having top and side surfaces formed on the second surface of the insulating layer, and a third passivation layer surrounding at least the top and side surfaces of the auxiliary electrode and spaced apart from the first passivation layer and the second passivation layer.

The light emitting package may further include a substrate on which the first LED sub-unit is disposed, the substrate having a top surface and side surfaces, an auxiliary electrode formed on the second surface of the insulating layer, and a third passivation layer substantially surrounding the auxiliary electrode, in which the first passivation layer may cover at least a portion of the top surface and a portion of side surfaces of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
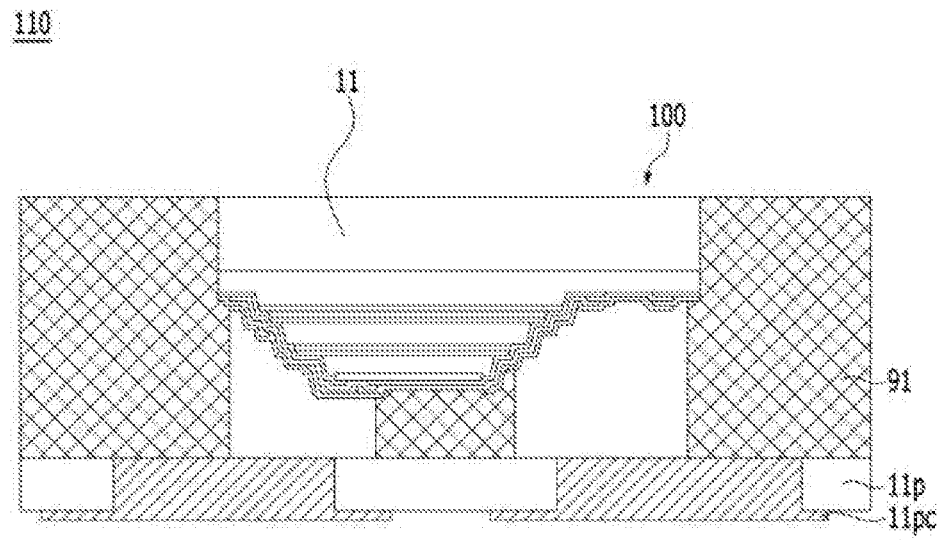
FIG. 1 is a schematic cross-sectional view of a light emitting package constructed according to an exemplary embodiment of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings. As used herein, a light emitting stacked structure, a light emitting chip, a light emitting package, or a light emitting module according to exemplary embodiments may include a micro-LED, which has a surface area less than about 10,000 square µm as known in the art. In other exemplary embodiments, the micro-LED's may have a surface area less than about 4,000 square µm, or less than about 2,500 square µm, depending upon the particular application.

FIG. 1 is a schematic cross-sectional view of a light emitting package constructed according to an exemplary embodiment of the invention.

Referring to FIG. 1, a light emitting package 110 according to the illustrated exemplary embodiment includes a light emitting chip 100, a molding layer 91 (or a first molding layer) surrounding at least the sides of the light emitting chip 100, an insulation layer 11$p$, and lead electrodes 11$pc$. An array of the light emitting chips may be formed on a substrate 11, and the light emitting chip 100 included in the light emitting package 110 of FIG. 1 exemplarily shows one that has been singularized from the array, which is then further processed to form the light emitting package 110.

The light emitting chip 100 according to an exemplary embodiment may include at least two or more light emitting sub-units or light emitting stacks that are disposed one over another along a direction intersecting a longitudinal direction of the substrate 11, such as a vertical direction. In this manner, the light emitting chip 100 may display various colors of light depending on the operating status of each light emitting stack, whereas a conventional light emitting device may display various colors by a combination of multiple light emitting cells emitting a single color of light. More particularly, a conventional light emitting device generally includes light emitting cells that respectively emit different color of light, e.g., red, green, and blue, which are spaced apart from each other along a two dimensional plane, to implement a full color display. As such, a relatively large area may be occupied by the conventional light emitting cells. The light emitting chip 100 constructed according to an exemplary embodiment, however, can emit light having various colors by stacking a plurality of light emitting stacks, thereby providing a high level of integration and implementing a full color spectrum through a significantly smaller area than that in the conventional light emitting device.

In addition, when the light emitting chip 100 including the light emitting stacked structure is mounted to another substrate to manufacture a display device, for example, the number of chips to be mounted may be significantly reduced as compared to the conventional light emitting devices due to its stacked structure. As such, manufacture of the display device that employs the light emitting stacked structure may be substantially simplified, especially when hundreds of thousands or millions of pixels are formed in one display device. The light emitting chip 100 may include a light emitting stacked structure as shown in FIG. 2, and a plurality of connection electrodes connected to the light emitting stacked structure, which will be described in more detail below.

The molding layer 91 may surround at least the sides of the light emitting chip 100 to protect the light emitting chip 100 from external impact. According to the illustrated exemplary embodiment, the molding layer 91 may expose a substrate 11 of the light emitting chip 100 to increase light efficacy. The insulation layer 11$p$ may include an organic insulating material or an inorganic insulating material, such as $SiO_2$, $SiN_x$, and $Al_2O_3$. The lead electrodes 11$pc$ may be electrically to the light emitting chip 100, which will be described in more detail later, through openings formed in the insulation layer 11$p$. The lead electrodes 11$pc$ may be spaced apart from each other at a predetermined pitch P (see FIG. 15). For example, the pitch P between the lead electrodes 11$pc$ may correspond to that of electrodes of a target substrate, such as a circuit board or a display device. In this manner, the light emitting package 110 according to an exemplary embodiment may be mounted on a conventional display device, without changing the configuration of the target substrate of the display device.

Figure 2:
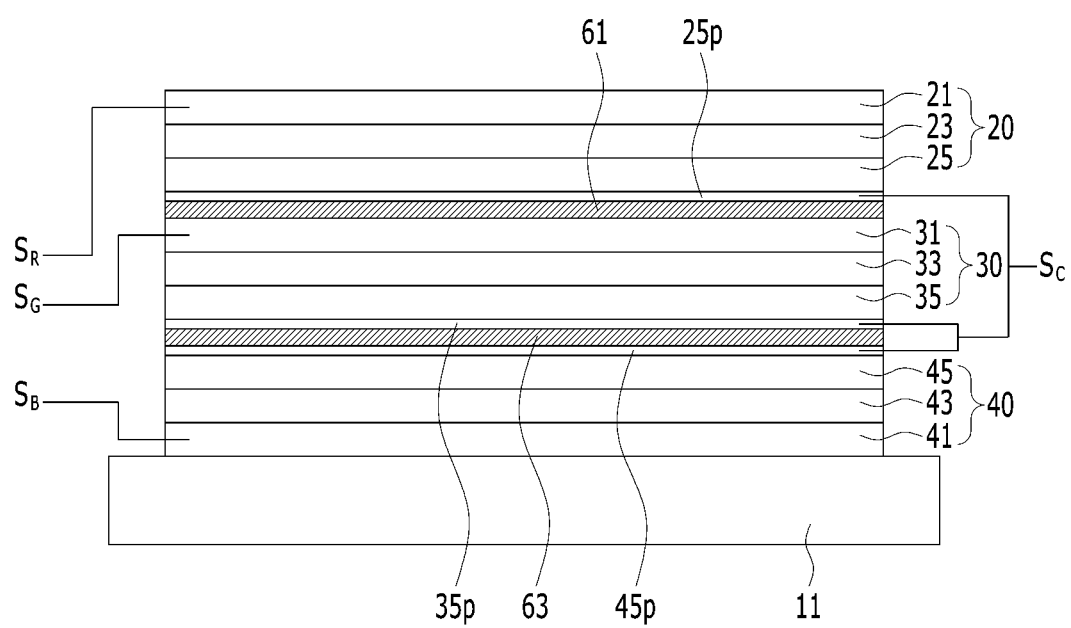
FIG. 2 is a schematic cross-sectional view of a light emitting stacked structure constructed according to an exemplary embodiment.
Figure 3A:
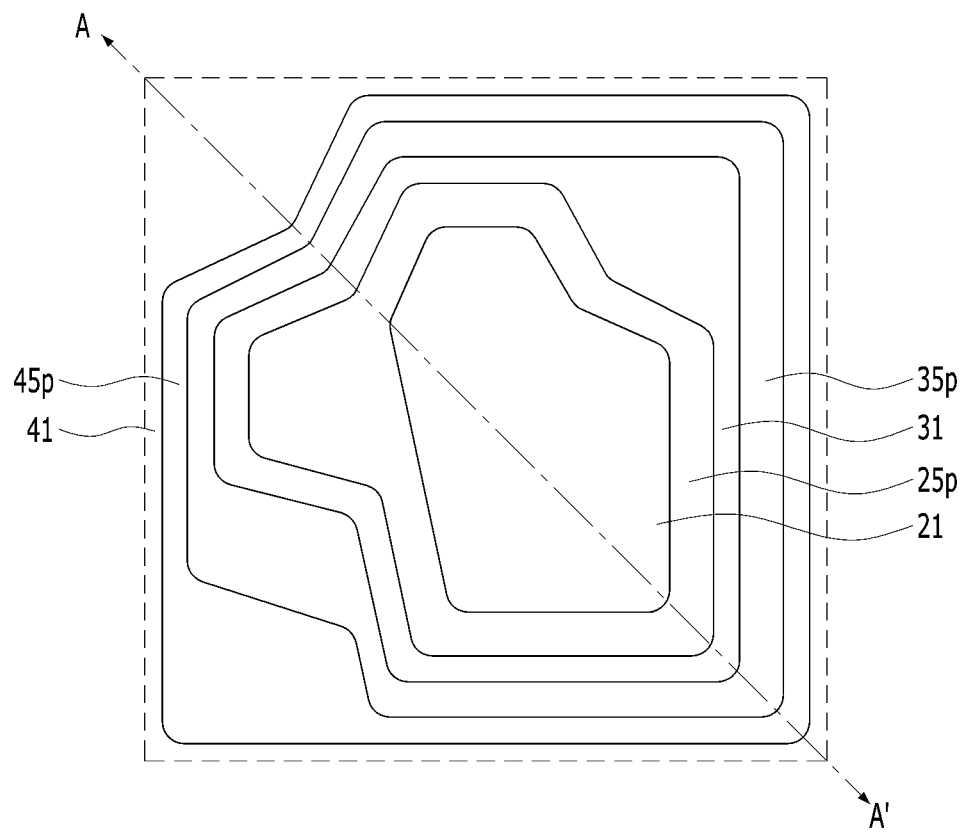
FIGS. 3A, 4A, 5A, 6A, 7A, and 8A are plan views illustrating a process of manufacturing a light emitting chip according to an exemplary embodiment.
Figure 3B:
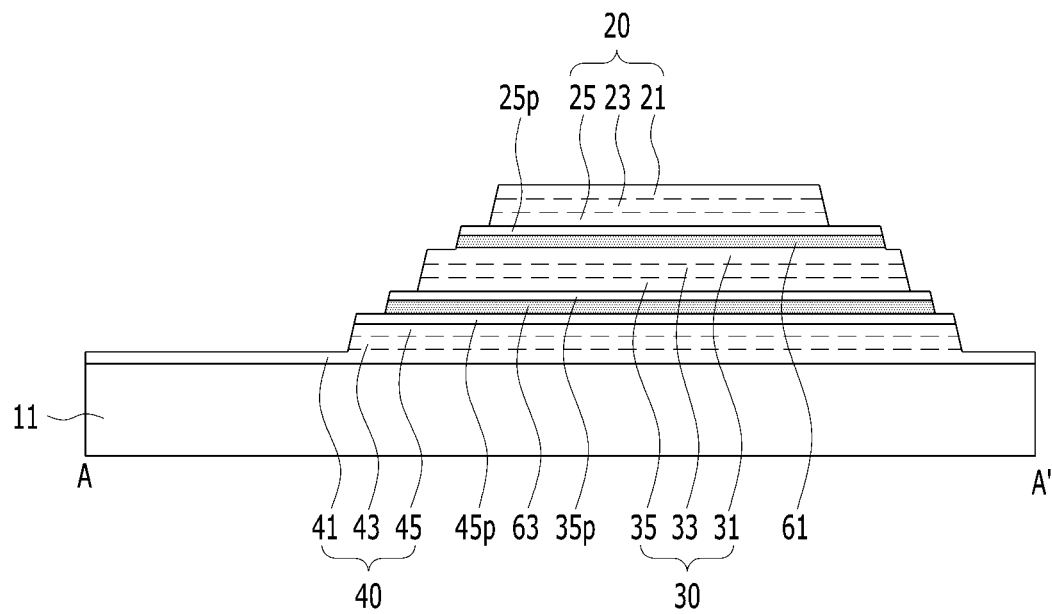
FIGS. 3B, 4B, 5B, 6B, 7B, and 8B are cross-sectional views taken along line A-A' of its corresponding plan view shown in FIGS. 3A, 4A, 5A, 6A, 7A, and 8A according to an exemplary embodiment.

FIG. 2 is a schematic cross-sectional view of a light emitting stacked structure constructed according to an exemplary embodiment.

Referring to FIG. 2, the light emitting stacked structure according to the illustrated exemplary embodiment includes a first LED sub-unit, a second LED sub-unit, and a third LED sub-unit disposed on the substrate 11. The first LED sub-unit may include a first light emitting stack 20, the second LED sub-unit may include a second light emitting stack 30, and the third LED sub-unit may include a third light emitting stack 40. While the drawings show the light emitting stacked structure including three light emitting stacks 20, 30, and 40, the inventive concepts are not limited to a particular number of light emitting stacks formed in the light emitting stacked structure. For example, in some exemplary embodiments, the light emitting stacked structure may include two or more light emitting stacks therein. Hereinafter, the light emitting stacked structure will be described with reference to one that includes three light emitting stacks 20, 30, and 40 according to an exemplary embodiment.

The substrate 11 may include a light transmitting insulating material to transmit light therethrough. In some exemplary embodiments, however, the substrate 11 may be formed to be semi-transparent to transmit only light having a specific wavelength, or formed to be partially transparent to transmit only a portion of light having the specific wavelength. The substrate 11 may be a growth substrate capable of epitaxially growing the third light emitting stack 40 thereon, such as a sapphire substrate. However, the inventive concepts are not limited thereto, and in some exemplary embodiments, the substrate 11 may include various other transparent insulating materials. For example, the substrate 11 may include a glass, a quartz, a silicon, an organic polymer, or an organic-inorganic composite material, such as silicon carbide (SiC), gallium nitride (GaN), indium gallium nitride (InGaN), aluminum gallium nitride (AlGaN), aluminum nitride (AlN), gallium oxide ($Ga_2O_3$), or silicon substrate. As another example, the substrate 11 in some exemplary embodiments may be a printed circuit board or a composite substrate including electrical lines therein for providing light emitting signals and a common voltage to each of the light emitting stacks formed thereon.

Each of the first, second, and third light emitting stacks 20, 30, and 40 is configured to emit light towards the substrate 11. As such, light emitted from the first light emitting stack 20, for example, may pass through the second and third light emitting stacks 30 and 40. According to an exemplary embodiment, light emitted from each of the first, second, and third light emitting stacks 20, 30, and 40 may have different wavelength bands from each other, and the light emitting stack that is disposed further away from the substrate 11 may emit light having a longer wavelength band. For example, the first, second, and third light emitting stacks 20, 30, and 40 may emit red light, green light, and blue light, respectively. However, the inventive concepts are not limited thereto. As another example, the first, second, and third light emitting stacks 20, 30, and 40 may emit red light, blue light, and green light, respectively. As still another example, in another exemplary embodiment, one or more of the light emitting stacks may emit light having substantially the same wavelength band. As still another example, when the light emitting stacked structure includes a micro-LED, which has a surface area less than about 10,000 square μm as known in the art, or less than about 4,000 square μm or 2,500 square μm in other exemplary embodiments, a light emitting stack that is disposed further away from the substrate 11 may emit light having a shorter wavelength band than light emitted from the one disposed closer to the substrate 11, without adversely affecting operation, due to the small form factor of a micro-LED. In this case, the micro-LED may be operated with low operating voltage, and thus, a separate color filter may not be required between the light emitting stacks. Hereinafter, the first, second, and third light emitting stacks 20, 30, and 40 will be exemplarily described as emitting red light, green light, and blue light, respectively, according to an exemplary embodiment.

The first light emitting stack 20 includes a first-type semiconductor layer 21, an active layer 23, and a second-type semiconductor layer 25. According to an exemplary embodiment, the first light emitting stack 20 may include a semiconductor material that emits red light, such as aluminum gallium arsenide (AlGaAs), gallium arsenide phosphide (GaAsP), aluminum gallium indium phosphide (AlGaInP), and gallium phosphide (GaP), without being limited thereto. A first lower contact electrode 25$p$ may be disposed under the second-type semiconductor layer 25 of the first light emitting stack 20.

The second light emitting stack 30 includes a first-type semiconductor layer 31, an active layer 33, and a second-type semiconductor layer 35. According to an exemplary embodiment, the second light emitting stack 30 may include a semiconductor material that emits green light, such as indium gallium nitride (InGaN), gallium nitride (GaN), gallium phosphide (GaP), aluminum gallium indium phosphide (AlGaInP), and aluminum gallium phosphide (AlGaP), without being limited thereto. A second lower contact electrode 35$p$ is disposed under the second-type semiconductor layer 35 of the second light emitting stack 30.

The third light emitting stack 40 includes a first-type semiconductor layer 41, an active layer 43, and a second-type semiconductor layer 45. According to an exemplary embodiment, the third light emitting stack 40 may include a semiconductor material that emits blue light, such as gallium nitride (GaN), indium gallium nitride (InGaN), and zinc selenide (ZnSe), without being limited thereto. A third lower contact electrode 45$p$ is disposed on the second-type semiconductor layer 45 of the third light emitting stack 40.

According to an exemplary embodiment, each of the first-type semiconductor layers 21, 31, and 41 and each of the second-type semiconductor layers 25, 35, and 45 of the first, second, and third light emitting stacks 20, 30, and 40 may have a single-layer structure or a multi-layered structure, and in some exemplary embodiments, may include a superlattice layer. In addition, the active layers 23, 33, and 43 of the first, second, and third light emitting stacks 20, 30, and 40 may have a single quantum well structure or a multiple quantum well structure.

Each of the first, second, and third lower contact electrodes 25$p$, 35$p$, and 45$p$ may include a transparent conductive material to transmit light. For example, the lower contact electrodes 25$p$, 35$p$, and 45$p$ may include a transparent conductive oxide (TCO), such as tin oxide (SnO), indium oxide (InO$_2$), zinc oxide (ZnO), indium tin oxide (ITO), and indium tin zinc oxide (ITZO), without being limited thereto.

A first adhesive layer 61 is disposed between the first light emitting stack 20 and the second light emitting stack 30, and a second adhesive layer 63 is disposed between the second light emitting stack 30 and the third light emitting stack 40. The first and second adhesive layers 61 and 63 may include a non-conductive material that transmits light. For example, the first and second adhesive layers 61 and 63 may each include an optical clear adhesive (OCA), which may include epoxy, polyimide, SU8, spin-on glass (SOG), benzocyclobutene (BCB), or others, without being limited thereto.

According to an exemplary embodiment, each of the first, second, and third light emitting stacks 20, 30, and 40 may be driven independently. More particularly, one of the first and second-type semiconductor layers of each light emitting stack may be applied with a common voltage Sc, and the other one of the first and second-type semiconductor layers of each light emitting stack may be applied with a respective light emitting signal $S_R$, $S_G$, and $S_B$. For example, according to the illustrated exemplary embodiment, the first-type semiconductor layers 21, 31, and 41 of each light emitting stack may be an n-type, and the second-type semiconductor layers 25, 35, and 45 of each light emitting stack may be a p-type. In this case, the third light emitting stack 40 may have a reversed stacked sequence as compared to the first and second light emitting stacks 20 and 30, such that the p-type semiconductor layer 45 is disposed on top of the active layer 43 to simplify the manufacturing process. Hereinafter, the first-type and second-type semiconductor layers may be interchangeably be referred to as p-type and n-type, respectively, according to the illustrated exemplary embodiment.

While the light emitting stacked structure according to the illustrated exemplary embodiment has a common p-type structure, however, the inventive concepts are not limited thereto. For example, in some exemplary embodiments, the first-type semiconductor layers 21, 31, and 41 of each light emitting stack may be a p-type, and the second-type semiconductor layers 25, 35, and 45 of each light emitting stack may be an n-type to form a common n-type light emitting stacked structure. Furthermore, in some exemplary embodiments, the stacked sequence of each light emitting stack may be variously modified without being limited to that shown in the drawings. Hereinafter, the light emitting stacked structure according to the illustrated exemplary embodiment will be described with reference to the common p-type light emitting stacked structure.

According to an exemplary embodiment, the light emitting stacked structure may further include various additional components to improve the purity and efficiency of light emitted therefrom. For example, in some exemplary embodiments, a wavelength pass filter may be formed between adjacent light emitting stacks to prevent or at least suppress light having a shorter wavelength from traveling towards a light emitting stack emitting a longer wavelength. In addition, in some exemplary embodiments, concave-convex portions may be formed on a light emitting surface of at least one of the light emitting stacks to balance the brightness of light between the light emitting stacks. For example, as green light generally has a higher visibility than red light and blue light, in some exemplary embodiments, the concave-convex portions may be formed on the light emitting stacks emitting red light or blue light to improve light efficiency thereof, thereby balancing the visibility between light emitted from the light emitting stacks.

Hereinafter, a method of forming a light emitting chip will be described with reference to the drawings according to an exemplary embodiment.

FIGS. 3A, 4A, 5A, 6A, 7A, and 8A are plan views illustrating a process of manufacturing a light emitting chip included in the light emitting package of FIG. 1 according to an exemplary embodiment. FIGS. 3B, 4B, 5B, 6B, 7B, and 8B are cross-sectional views taken along line A-A' of its corresponding plan view shown in FIGS. 3A, 4A, 5A, 6A, 7A, and 8A according to an exemplary embodiment.

Referring back to FIG. 2, the first-type semiconductor layer 41, the third active layer 43, and the second-type semiconductor layer 45 of the third light emitting stack 40 may be sequentially grown on the substrate 11 by a metal organic chemical vapor deposition (MOCVD) method or a molecular beam epitaxy (MBE) method, for example. The third lower contact electrode 45p may be formed on the third p-type semiconductor layer 45 by a physical vapor deposition method or a chemical vapor deposition method, for example, and may include a transparent conductive oxide (TCO). When the third light emitting stack 40 emits blue light according to an exemplary embodiment, the substrate 11 may include $Al_2O_3$ (e.g., sapphire substrate), and the third lower contact electrode 45p may include a transparent conductive oxide (TCO), such as tin oxide (SnO), indium oxide ($InO_2$), zinc oxide (ZnO), indium tin oxide (ITO), indium tin zinc oxide (ITZO) or the like, without being limited thereto. The first and second light emitting stacks 20 and 30 may be similarly formed by sequentially growing the first-type semiconductor layer, the active layer, and the second-type semiconductor layer on a temporary substrate, respectively, and the lower contact electrode including a transparent conductive oxide may be respectively formed on the second-type semiconductor layer by a chemical vapor deposition method or the like, for example.

According to an exemplary embodiment, the first and second light emitting stacks 20 and 30 may be adjoined to each other with the first adhesive layer 61 interposed therebetween, and at least one of the temporary substrates of the first and second light emitting stacks 20 and 30 may be removed by a laser lift off process, chemical process, mechanical process, or the like, for example. In this case, in some exemplary embodiments, concave-convex portions may be formed on the exposed light emitting stack to improve light extraction efficiency. Then, the first and second light emitting stacks 20 and 30 may be adjoined with the third light emitting stack 40 with the second adhesive layer 63 interposed therebetween, and the remaining one of the temporary substrates of the first and second light emitting stacks 20 and 30 may be removed by a laser lift off process, chemical process, mechanical process, or the like, for example. In this case, in some exemplary embodiments, concave-convex portions may be formed on the remaining exposed light emitting stack to improve light extraction efficiency.

In another exemplary embodiment, the second adhesive layer 63 may be formed on the third light emitting stack 40. Then, the second light emitting stack 30 may be adjoined to the third light emitting stack 40 with the second adhesive layer 63 interposed between, and the temporary substrate of the second light emitting stack 30 may be removed by a laser lift off process, chemical process, mechanical process, or the like. Then, the first adhesive layer 61 may be formed on the second light emitting stack 30. The first light emitting stack 20 may then be adjoined to the second light emitting stack 30 with the first adhesive layer 61 interposed therebetween. Once the first light emitting stack 20 is coupled to the second light emitting stack 30 that is coupled to the third light emitting stack 40, the temporary substrate of the first light emitting stack 20 may be removed by a laser lift off process, chemical process, mechanical process, or the like. In some exemplary embodiments, concave-convex portions may be formed on one or more surfaces of one light emitting stack before or after being coupled to another light emitting stack to improve light extraction efficiency Referring to FIGS. 3A and 3B, various portions of each of the first, second, and third light emitting stacks 20, 30, and 40 may be patterned via etching process or the like to expose portions of the first-type semiconductor layer 21, first lower contact electrode 25p, first-type semiconductor layer 31, second lower contact electrode 35p, third lower contact electrode 45p, and first-type semiconductor layer 41. According to the illustrated exemplary embodiment, the first light emitting stack 20 has the smallest area among the light emitting stacks 20, 30, and 40. However, the inventive concepts are not limited to relative sizes of the light emitting stacks 20, 30, and 40.

Figure 4A:
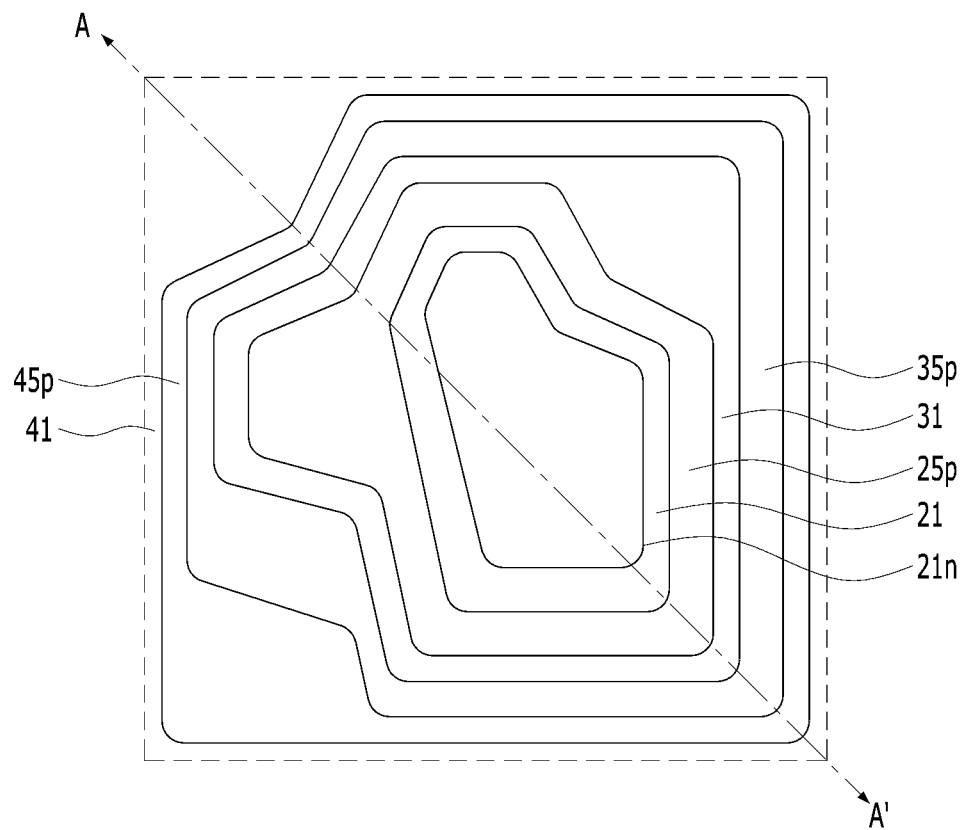
Figure 4B:
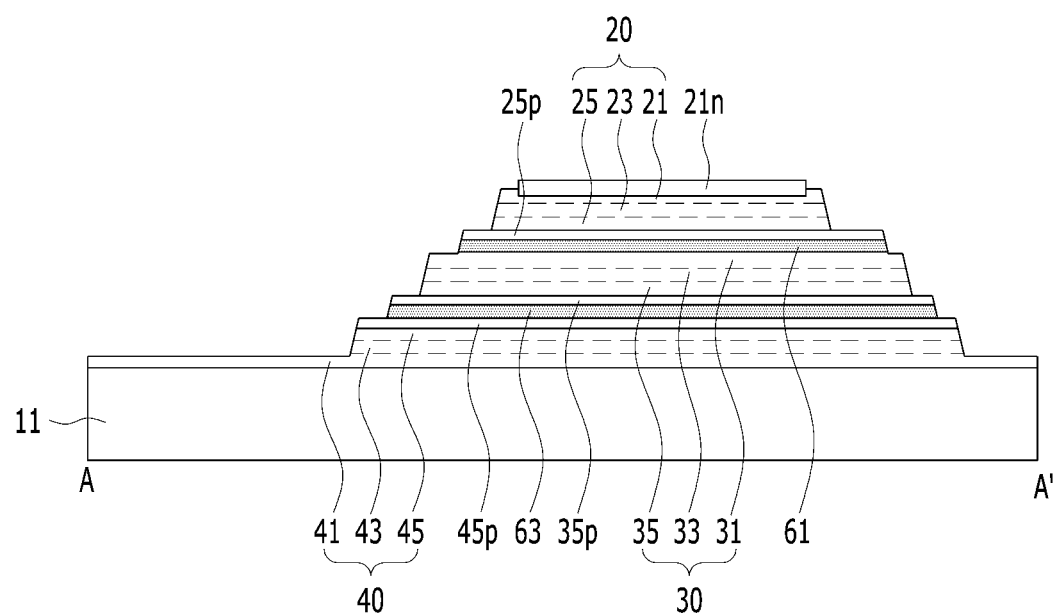

Referring to FIGS. 4A and 4B, a portion of a top surface of the first-type semiconductor layer 21 of the first light emitting stack 20 may be patterned, such as via wet-etching, at which a first upper contact electrode 21n may be formed. In this manner, the level of ohmic contact may be increased between the first-type semiconductor layer 21 and the first upper contact electrode 21n. The first upper contact electrode 21n may have a single-layer structure or a multi-layered structure, and may include Al, Ti, Cr, Ni, Au, Ag, Sn, W, Cu, or an alloy thereof, such as Au—Te alloy or an Au—Ge alloy, without being limited thereto. In an exemplary embodiment, the first upper contact electrode 21n may have a thickness of about 100 nm, and include metal having high reflectance to increase light emission efficiency in a downward direction towards the substrate 11.

Figure 5A:
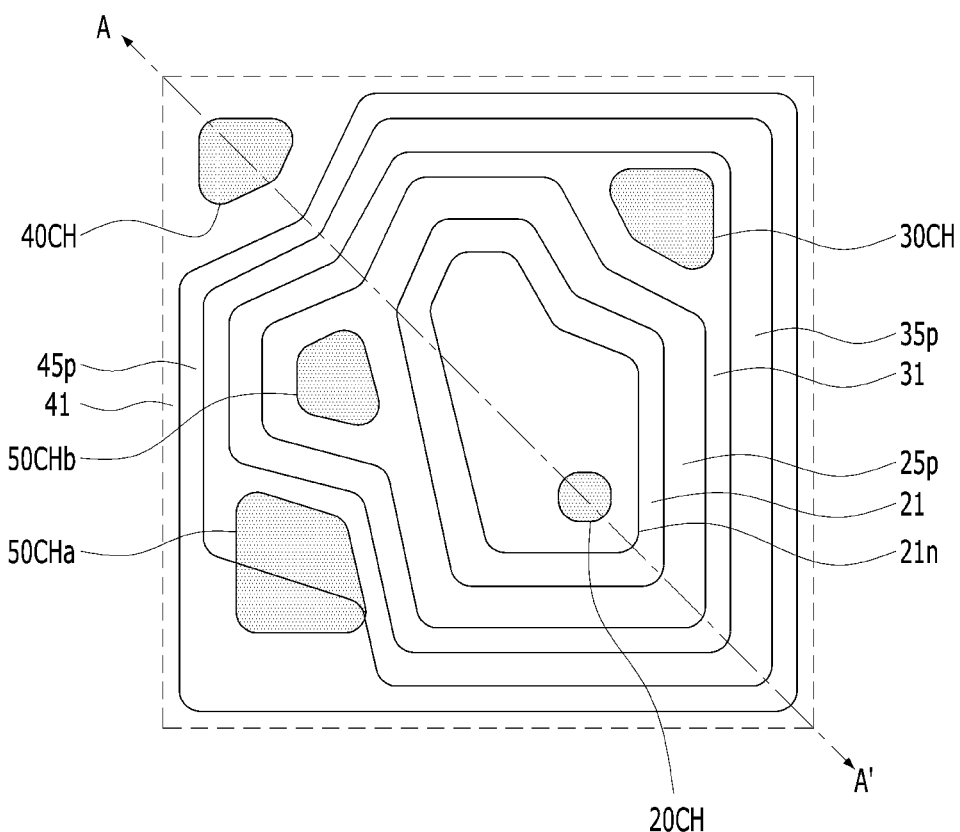
Figure 5B:
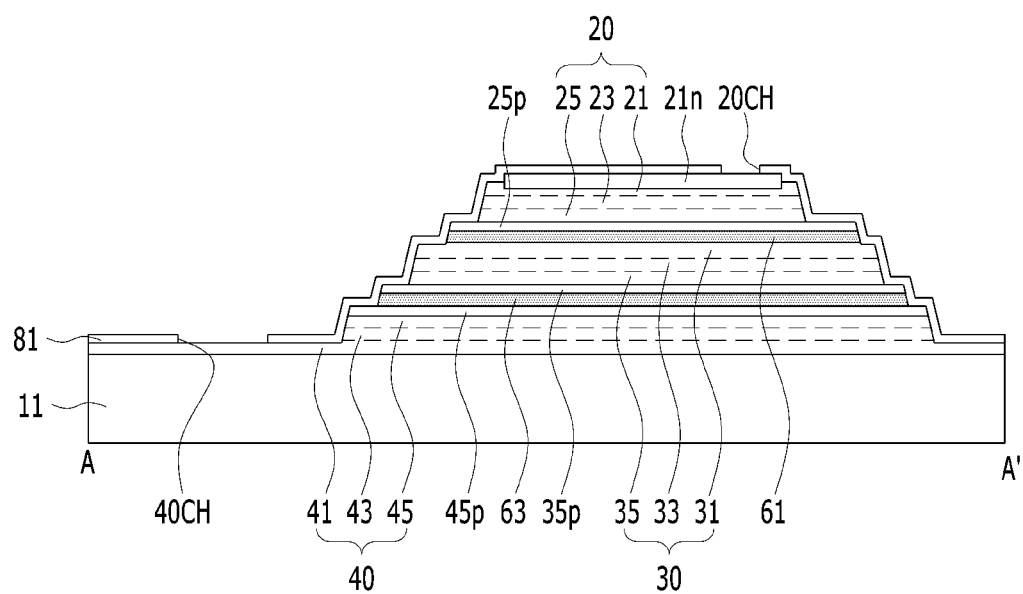

Referring to FIGS. 5A and 5B, a first insulating layer 81 may be disposed on at least a portion of side surfaces of the first, second, and third light emitting stacks 20, 30, and 40. The first insulating layer 81 may include various organic or inorganic insulating materials, such as polyimide, $SiO_2$, $SiN_x$, $Al_2O_3$, or the like. For example, the first insulating layer 81 may include a distributed Bragg reflector (DBR). As another example, the first insulating layer 81 may include a black-colored organic polymer. In some exemplary embodiments, a metal reflection layer that is electrically floated may be further disposed on the first insulating layer 81 reflect light emitted from the light emitting stacks 20, 30, and 40 towards the substrate 11. In some exemplary embodiments, the first insulating layer 81 may have a single-layered or a multi-layered structure formed of two or more insulating layers having different refractive indices from each other.

According to an exemplary embodiment, portions of the first insulating layer 81 may be removed to form first, second, third, and fourth contact holes 20CH, 30CH, 40CH, and 50CH. The first contact hole 20CH is defined on the first n-type contact electrode 21n to expose a portion of the first n-type contact electrode 21n. The second contact hole 30CH may expose a portion of the first-type semiconductor layer 31 of the second light emitting stack 30. The third contact hole 40CH may expose a portion of the first-type semiconductor layer 41 of the third light emitting stack 40. The fourth contact hole 50CH may expose portions of the first, second, and third lower contact electrodes 21p, 31p, and 41p. The fourth contact hole 50CH may include the first sub-contact hole 50CHa exposing a portion of the first lower contact electrode 25p and the second sub-contact hole 50CHb exposing the second and third lower contact electrodes 35*p* and 45*p*. In some exemplary embodiments, however, a single first sub-contact hole CH may expose each of the first, second, and third lower contact electrodes 21*p*, 31*p*, and 41*p*.

Figure 6A:
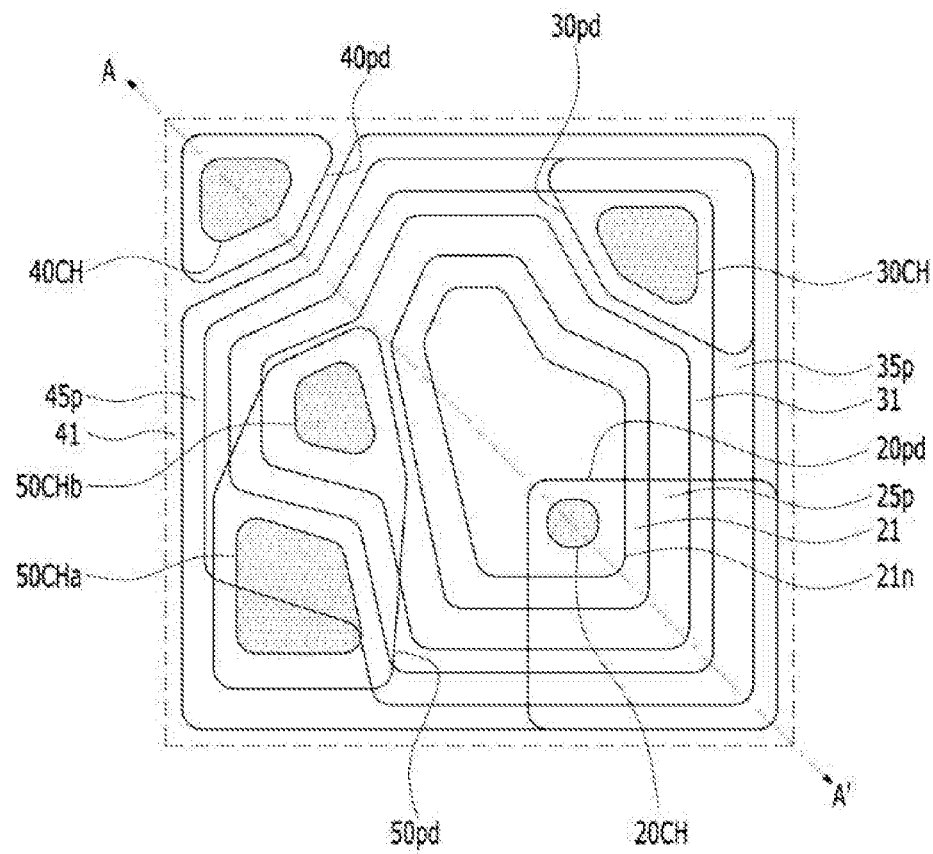
Figure 6B:
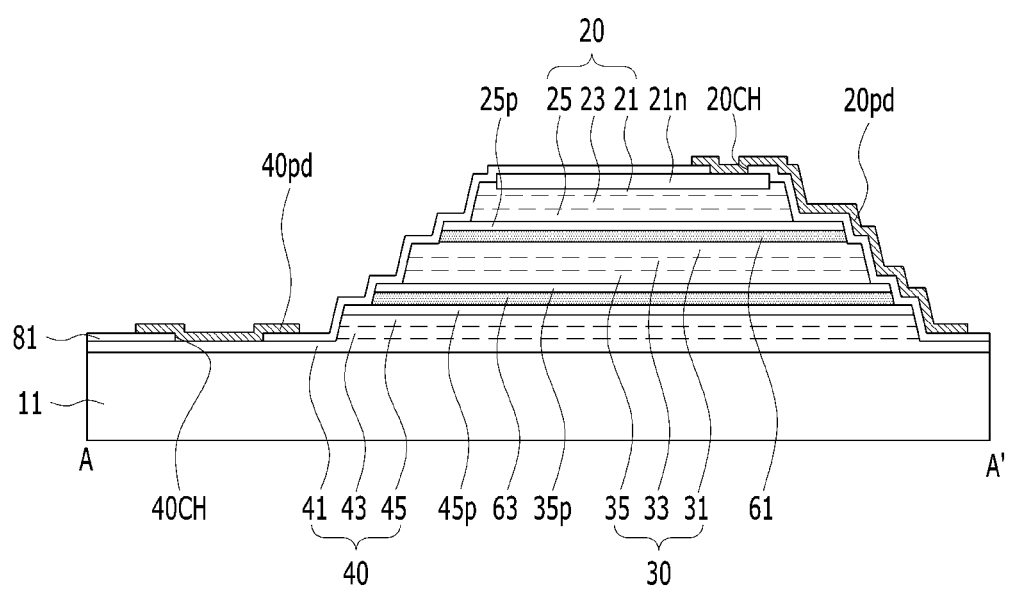

Referring to FIGS. 6A and 6B, first, second, third, and fourth pads 20*pd*, 30*pd*, 40*pd*, and 50*pd* are formed on the first insulating layer 81 formed with the first, second, third, and fourth contact holes 20CH, 30CH, 40CH, and 50CH. The first, second, third, and fourth pads 20*pd*, 30*pd*, 40*pd*, and 50*pd* may be formed by, for example, forming a conductive layer on substantially the entire surface of the substrate 11, and patterning the conductive layer using a photolithography process or the like.

The first pad 20*pd* is formed to overlap an area where the first contact hole 20CH is formed, such that the first pad 20*pd* may be connected to the first upper contact electrode 21*n* of the first light emitting stack 20 through the first contact hole 20CH. The second pad 30*pd* is formed to overlap an area where the second contact hole 30CH is formed, such that the second pad 30*pd* may be connected to the first-type semiconductor layer 31 of the second light emitting stack 30 through the second contact hole 30CH. The third pad 40*pd* is formed to overlap an area where the third contact hole 40CH is formed, such that the third pad 40*pd* may be connected to the first-type semiconductor layer 41 of the third light emitting stack 40 through the third contact hole 40CH. The fourth pad 50*pd* is formed to overlap with an area where the fourth contact hole 50CH is formed, more particularly, where the first and second sub-contact holes 50CHa and 50CHb are formed, such that the fourth pad 50*pd* may be connected to the first, second, and third lower contact electrodes 25*p*, 35*p*, and 45*p* of the first, second, and third light emitting stacks 20, 30, and 40 through the first and second sub-contact holes 50CHa and 50CHb.

Figure 7A:
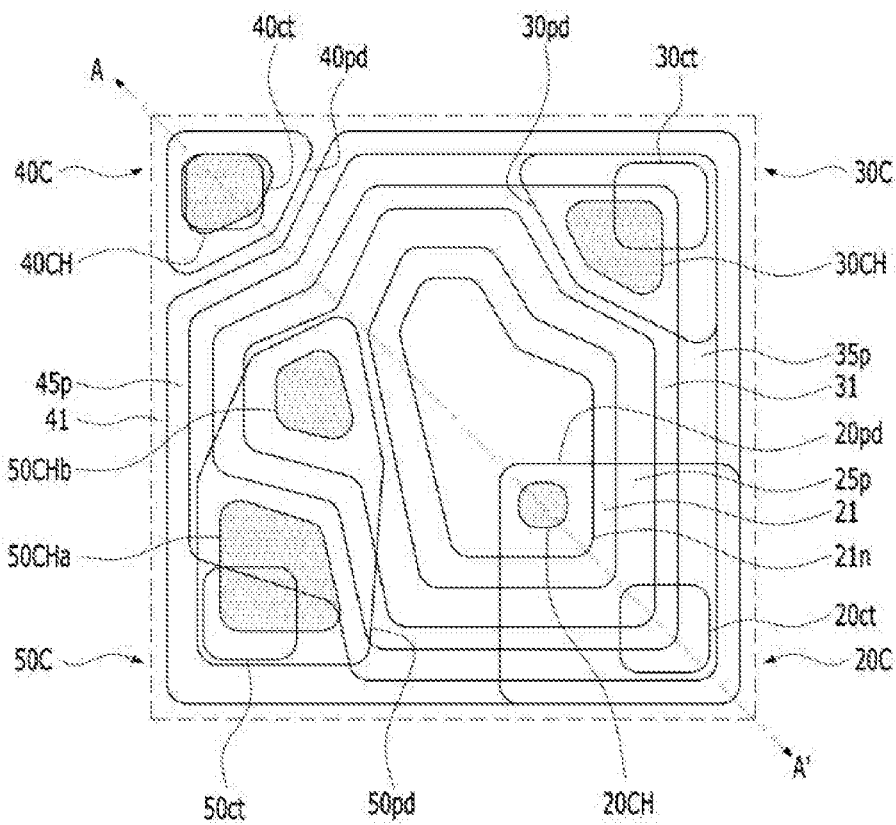
Figure 7B:
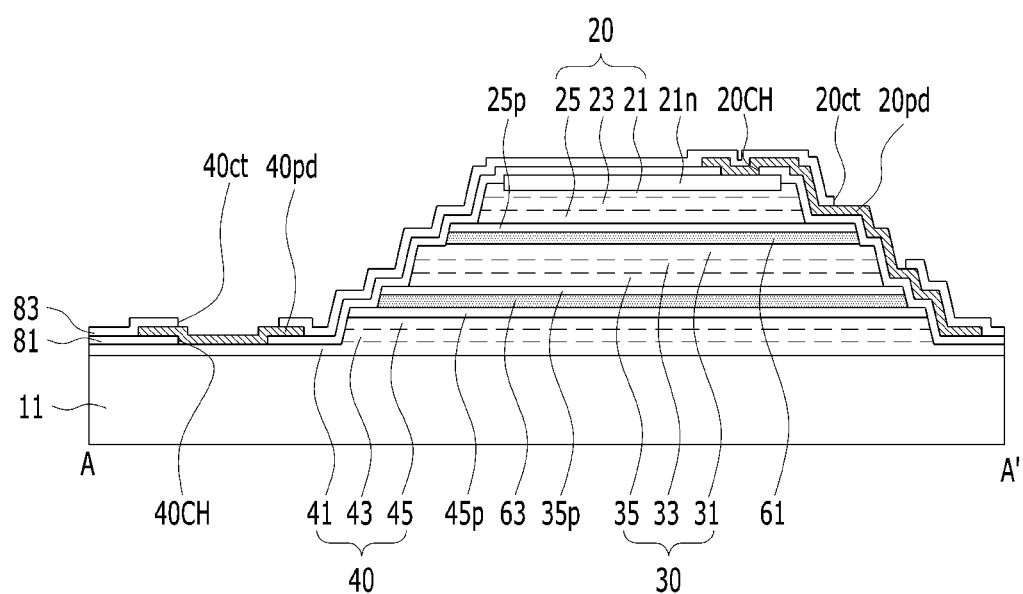

Referring to FIGS. 7A and 7B, a second insulating layer 83 may be formed on the first insulating layer 81. The second insulating layer 83 may include various organic or inorganic insulating materials, such as polyimide, $SiO_2$, $SiN_x$, $Al_2O_3$, or the like. For example, the second insulating layer 83 may include a distributed Bragg reflector (DBR). As another example, the second insulating layer 83 may include a black-colored organic polymer. In some exemplary embodiments, a metal reflection layer that is electrically floated may be further disposed on the second insulating layer 83 to reflect light emitted from the light emitting stacks 20, 30, and 40 towards the substrate 11. In some exemplary embodiments, the second insulating layer 83 may have a single-layered or a multi-layered structure formed of two or more insulating layers having different refractive indices from each other. The second insulating layer 83 is then patterned and to form first, second, third, and fourth through holes 20*ct*, 30*ct*, 40*ct*, and 50*ct* therein.

The first through hole 20*ct* formed on the first pad 20*pd* exposes a portion of the first pad 20*pd*. The second through hole 30*ct* formed on the second pad 30*pd* exposes a portion of the second pad 30*pd*. The third through hole 40*ct* formed on the third pad 40*pd* exposes a portion of the third pad 40*pd*. The fourth through hole 50*ct* formed on the fourth pad 50*pd* exposes a portion of the fourth pad 50*pd*. In the illustrated exemplary embodiment, the first, second, third, and fourth through holes 20*ct*, 30*ct*, 40*ct*, and 50*ct* may be respectively defined in areas where the first, second, third, and fourth pads 20*pd*, 30*pd*, 40*pd*, and 50*pd* are formed.

Figure 8A:
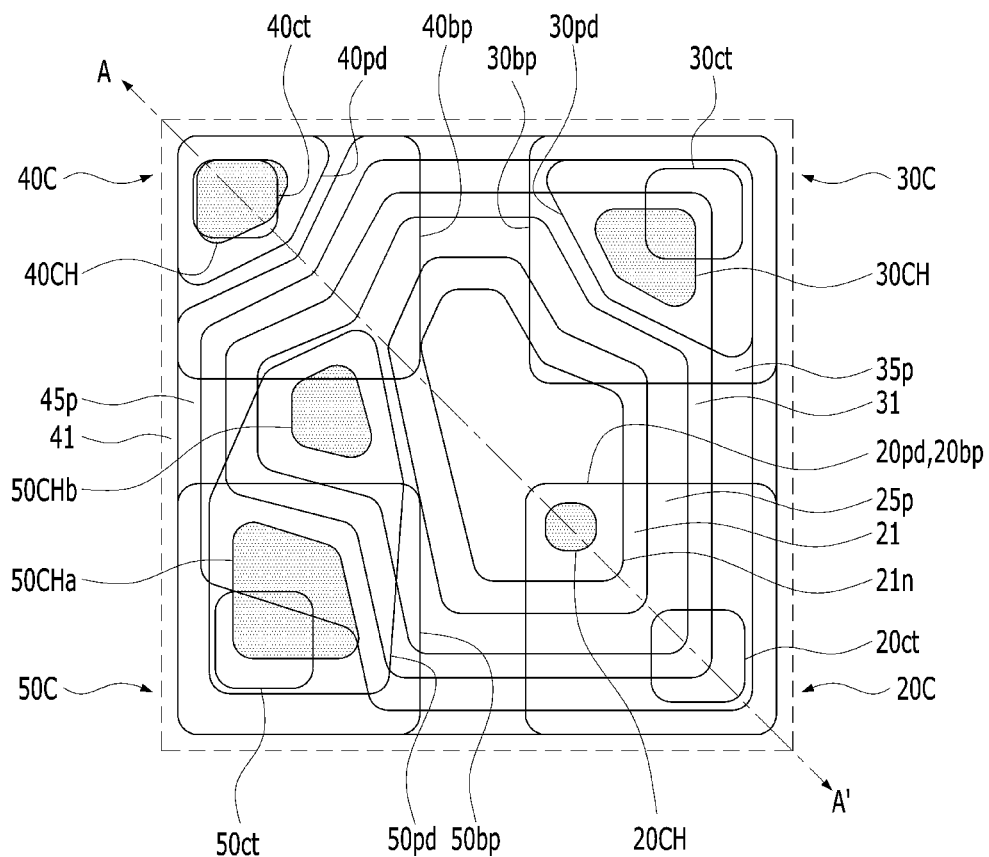
Figure 8B:
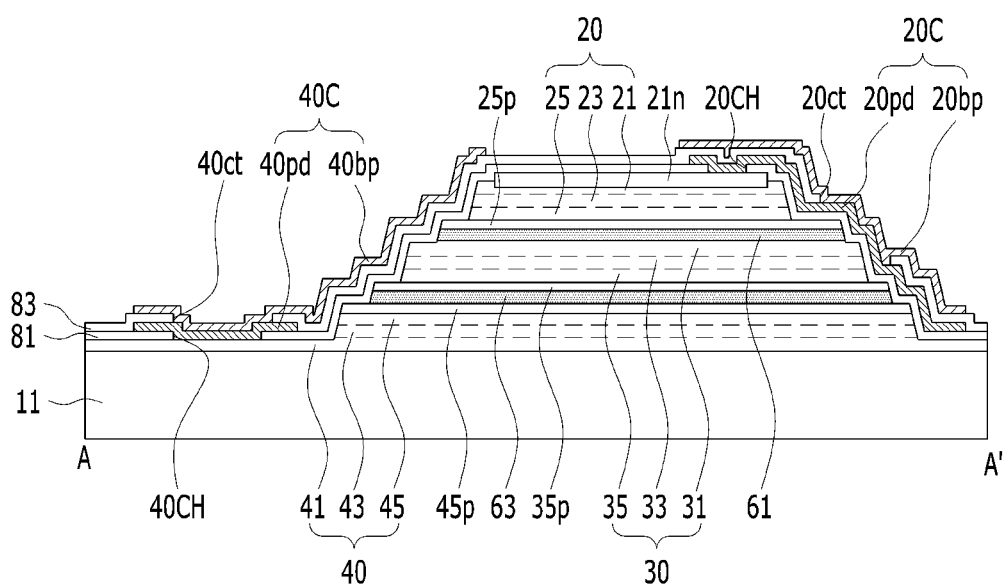

Referring to FIGS. 8A and 8B, first, second, third, and fourth bump electrodes 20*bp*, 30*bp*, 40*bp*, and 50*bp* are formed on the second insulating layer 83 formed with the first, second, third, and fourth through holes 20*ct*, 30*ct*, 40*ct*, and 50*ct*. The first bump electrode 20*bp* formed to overlap an area where the first through hole 20*ct* is formed, such that the first bump electrode 20*bp* may be connected to the first pad 20*pd* through the first through hole 20*ct*. The second bump electrode 30*bp* is formed to overlap an area where the second through hole 30*ct* is formed, such that the second bump electrode 30*bp* may be connected to the second pad 30*pd* through the second through hole 30*ct*. The third bump electrode 40*bp* is formed to overlap an area where the third through hole 40*ct* is formed, such that the third bump electrode 40*bp* may be connected to the third pad 40*pd* through the third through hole 40*ct*.

The fourth bump electrode 50*bp* is formed to overlap with an area where the fourth through hole 50*ct* is formed, such that the fourth bump electrode 50*bp* is connected to the fourth pad 50*pd* through the fourth through hole 50*ct*. More particularly, the fourth pad 50*pd* is connected to the second-type semiconductor layers 25, 35, and 45 of the first, second, and third light emitting stacks 20, 30, and 40 through a first sub-contact hole 50CHa and a second sub-contact hole 50CHb defined on the first, second, and third lower contact electrodes 25*p*, 35*p*, and 45*p* of the first, second, and third light emitting stacks 20, 30, and 40. In particular, the fourth pad 50*pd* is connected to the first lower contact electrode 25*p* through the second sub-contact hole 50CHb, and is connected to the second and third lower contact electrodes 35*p* and 45*p* through the first sub-contact hole 50CHa. In this manner, since the fourth pad 50*pd* can be connected to the second and third lower contact electrodes 35*p* and 45*p* through a single first sub-contact hole 50CHa, a manufacturing process of the light emitting chip 100 may be simplified, and an area occupied by the contact holes in the light emitting chip 100 may be reduced. At least a portion of the fourth bump electrode 50*bp* may overlap with the fourth pad 50*pd*. The fourth bump electrode 50*bp* is connected to the fourth pad 50*pd* through a fourth through hole 50*ct* with the second insulating layer 83 interposed therebetween in an overlapping area between the fourth bump electrode 50*bp* and the fourth pad 50*pd*.

The first, second, third, and fourth bump electrodes 20*bp*, 30*bp*, 40*bp*, and 50*bp* may be formed by depositing a conductive layer on the substrate 11, and patterning the conductive layer, for example, which may include at least one of Ni, Ag, Au, Pt, Ti, Al, Cr, Wi, TiW, Mo, Cu, TiCu, or the like. Hereinafter, the first pad 20*pd* and the first bump electrode 20*bp* may be collectively be referred to as a first contact part 20C, the second pad 30*pd* and the second bump electrode 30*bp* may be collectively be referred to as a second contact part 30C, the third pad 40*pd* and the third bump electrode 40*bp* may be collectively be referred to as a third contact part 40C, and the fourth pad 50*pd* and the fourth bump electrode 50*bp* may be collectively be referred to as a fourth contact part 50C.

According to an exemplary embodiment, the first, second, third, and fourth contact parts 20C, 30C, 40C, and 50C may be formed at various locations. For example, when the light emitting chip 100 has a substantially quadrangular shape as shown in the drawings, the first, second, third, and fourth contact parts 20C, 30C, 40C, and 50C may be disposed around each corner of the substantially quadrangular shape. However, the inventive concepts are not limited thereto, and in some exemplary embodiments, the light emitting chip 100 may be formed to have various shapes, and the first, second, third, and fourth contact parts 20C, 30C, 40C, and 50C may be formed in other places depending on the shape of the light emitting device.

The first, second, third, and fourth pads 20*pd*, 30*pd*, 40*pd*, and 50*pd* are spaced apart from and insulated from each other. In addition, the first, second, third, and fourth bump electrodes 20*bp*, 30*bp*, 40*bp*, and 50*bp* are spaced apart from and insulated from each other. According to an exemplary embodiment, each of the first, second, third, and fourth bump electrodes 20*bp*, 30*bp*, 40*bp*, and 50*bp* may cover at least a portion of side surfaces of the first, second, and third light emitting stacks 20, 30, and 40, which may facilitate dissipation of heat generated from the first, second, and third light emitting stacks 20, 30, and 40 therethrough.

The inventive concepts are not limited to a particular structure of the contact parts 20C, 30C, 40C, and 50C. For example, in some exemplary embodiments, the bump electrode 20*bp*, 30*bp*, 40*bp*, or 50*bp* may be omitted from at least one the contact parts 20C, 30C, 40C, and 50C. In this case, the pads 20*pd*, 30*pd*, 40*pd*, and 50*pd* of the contact parts 20C, 30C, 40C, and 50C may be connected to the respective connection electrodes 20*ce*, 30*ce*, 40*ce*, and 50*ce*.

Figure 9A:
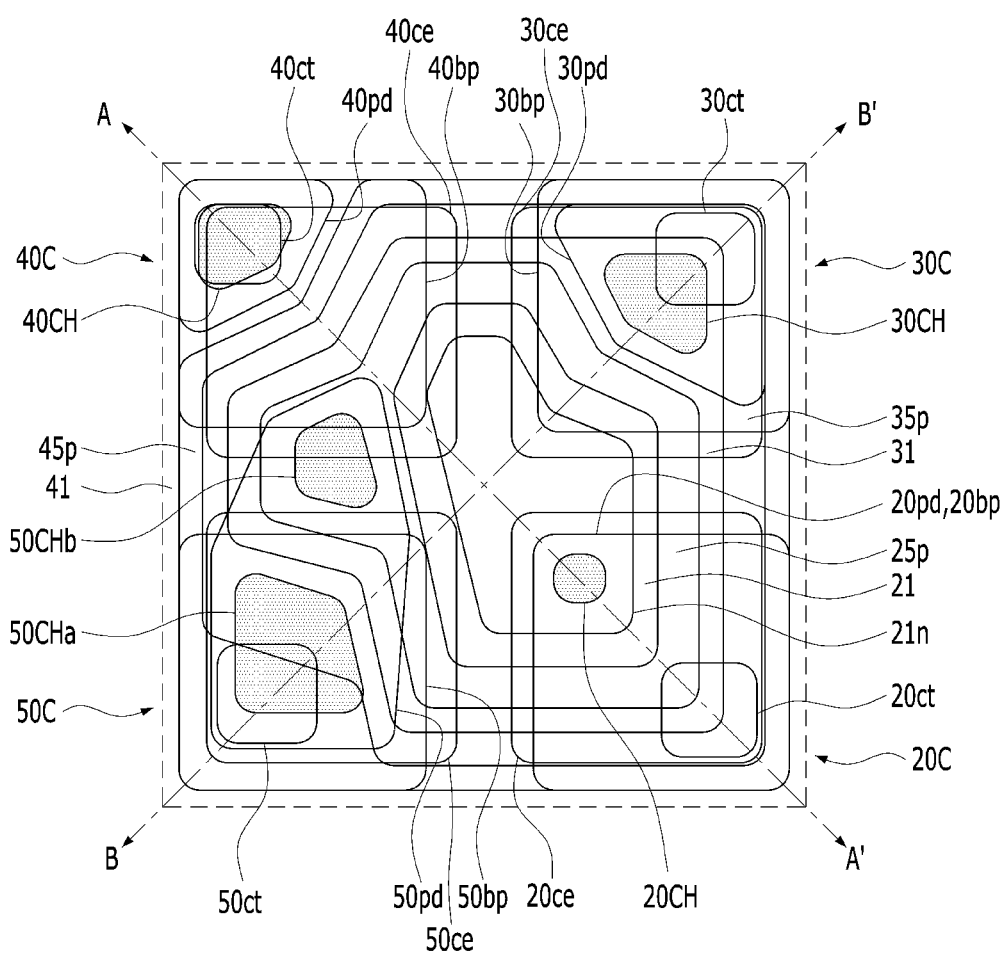
FIG. 9A is a schematic plan view a light emitting chip constructed according to an exemplary embodiment.
Figure 9B:
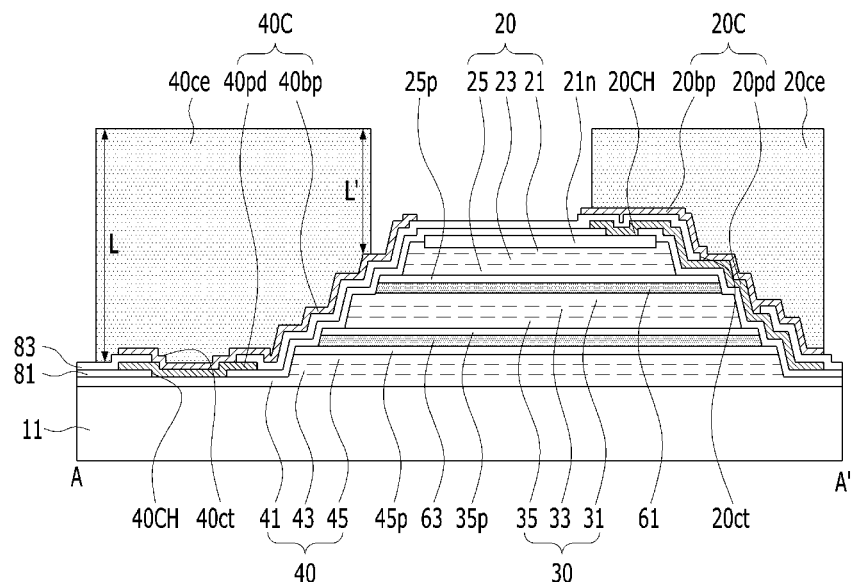
FIG. 9B and FIG. 9C are schematic cross-sectional views taken along line A-A' and line B-B' of FIG. 9A, respectively.
Figure 9C:
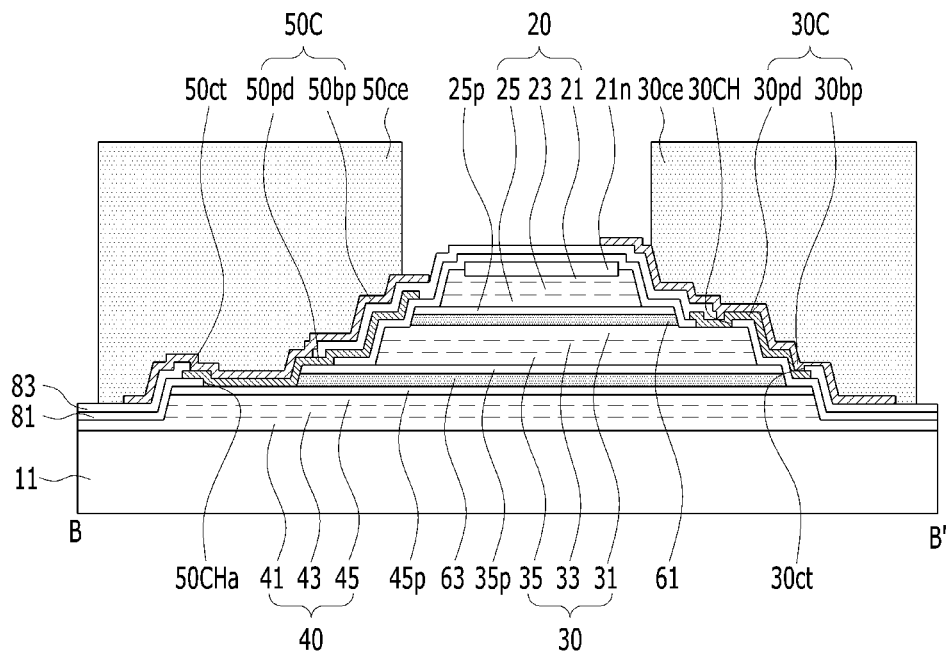

FIG. 9A is a schematic plan view of a light emitting chip constructed according to an exemplary embodiment, and FIGS. 9B and 9C are cross-sectional views taken along line A-A' and line B-B' of FIG. 9A, respectively.

Referring to FIGS. 9A and 9B, first, second, third, and fourth connection electrodes 20*ce*, 30*ce*, 40*ce*, and 50*ce* spaced apart from each other may be formed on the light emitting stacked structure. The first, second, third, and fourth connection electrodes 20*ce*, 30*ce*, 40*ce*, and 50*ce* may be electrically connected to the first, second, third, and fourth bump electrodes 20*bp*, 30*bp*, 40*bp*, and 50*bp*, respectively, to transmit an external signal to each of the light emitting stacks 20, 30, and 40. More particularly, according to the illustrated exemplary embodiment, the first connection electrode 20*ce* may be connected to the first bump electrode 20*bp*, which is connected to the first upper contact electrode 21*n* through the first pad 20*pd*, to be electrically connected to the first-type semiconductor layer 21 of the first light emitting stack 20. The second connection electrode 30*ce* may be connected to the second bump electrode 30*bp*, which is connected to the second pad 30*pd*, to be electrically connected to the first-type semiconductor layer 31 of the second light emitting stack 30. The third connection electrode 40*ce* may be connected to the third bump electrode 40*bp*, which is connected to the third pad 40*pd*, to be electrically connected to the first-type semiconductor layer 41 of the third light emitting stack 40. The fourth connection electrode 50*ce* may be connected to the fourth bump electrode 50*bp*, which is connected to the fourth pad 50*pd*, to be electrically connected to the second-type semiconductor layers 25, 35, and 45 of the light emitting stacks 20, 30, and 40 via the first, second, and third lower contact electrodes 25*p*, 35*p*, and 45*p*, respectively.

According to the illustrated exemplary embodiment, each of the connection electrodes 20*ce*, 30*ce*, 40*ce*, and 50*ce* may have a substantially elongated shape that projects vertically away from the substrate 11. The connection electrodes 20*ce*, 30*ce*, 40*ce*, and 50*ce* may include metal, such as Cu, Ni, Ti, Sb, Zn, Mo, Co, Sn, Ag, or an alloy thereof, without being limited thereto. For example, each of the connection electrodes 20*ce*, 30*ce*, 40*ce*, and 50*ce* may include two or more metals or a plurality of different metal layers to reduce the stress applied thereto from the elongated shape of the connection electrodes 20*ce*, 30*ce*, 40*ce*, and 50*ce*. In another exemplary embodiment, when the connection electrodes 20*ce*, 30*ce*, 40*ce*, and 50*ce* include Cu, an additional metal may be deposited or plated thereon to suppress oxidation of Cu. In some exemplary embodiments, when the connection electrodes 20*ce*, 30*ce*, 40*ce*, and 50*ce* include Cu/Ni/Sn, Cu may prevent Sn from being infiltrating into the light emitting stacked structure. In some exemplary embodiments, the connection electrodes 20*ce*, 30*ce*, 40*ce*, and 50*ce* may include a seed layer for forming metal layer during a plating process, which will be described in more detail below.

As shown in the drawings, each of the connection electrodes 20*ce*, 30*ce*, 40*ce*, and 50*ce* may have a substantially flat upper surface to facilitate an electrical connection between the light emitting stacked structure with external lines or electrodes to be described later. According to an exemplary embodiment, when the light emitting chip includes a micro-LED, which has a surface area less than about 10,000 square μm as known in the art, or less than about 4,000 square μm or 2,500 square μm in other exemplary embodiments, the connection electrodes 20*ce*, 30*ce*, 40*ce*, and 50*ce* may overlap a portion of at least one of the first, second, and third light emitting stacks 20, 30, and 40 as shown in the drawings. More particularly, the connection electrodes 20*ce*, 30*ce*, 40*ce*, and 50*ce* may overlap at least one step formed in a side surface of the light emitting stacked structure. In this manner, since an area of the bottom surface of a connection electrode is greater than the top surface thereof, a greater contacting area may be formed between the connection electrodes 20*ce*, 30*ce*, 40*ce*, and 50*ce* and the light emitting stacked structure. Accordingly, the connection electrodes 20*ce*, 30*ce*, 40*ce*, and 50*ce* may be more stably formed on the light emitting stacked structure. For example, one side surface L of the connection electrodes 20*ce*, 30*ce*, 40*ce*, and 50*ce* that faces the outside and the other side surface L' thereof facing the center of the light emitting chip 100 may have different lengths (or heights). More particularly, the length of one side surface L of a connection electrode facing the outside may be greater than that of the other surface L' thereof facing the center of the light emitting chip 100. For example, the difference in length between the two opposing surfaces L and L' of a connection electrode may be greater than a thickness (or height) of at one of the LED stacks 20, 30, and 40. In this manner, the structure of the light emitting chip may be reinforced with a greater contact area between the connection electrodes 20*ce*, 30*ce*, 40*ce*, and 50*ce* and the light emitting stacked structure. In addition, since the connection electrodes 20*ce*, 30*ce*, 40*ce*, and 50*ce* may overlap at least one step formed in a side surface of the light emitting stacked structure, heat generated from the light emitting stacked structure may be more efficiently dissipated to the outside.

According to an exemplary embodiment, the different in length between one side surface of the connection electrode L facing the outside and the other surface thereof L' facing the center of the light emitting chip 100 may be about 3 μm. In this case, the light emitting stacked structure may be formed to be thin, and in particular, the first LED stack 20 may have a thickness of about 1 μm, the second LED stack 30 may have a thickness of about 0.7 μm, the third LED stack 40 may have a thickness of about 0.7 μm, and the first and second adhesive layers may each have a thickness of about 0.2 to about 0.3 μm, without being limited thereto. According to another exemplary embodiment, the different in length between one side surface of the connection electrode L facing the outside and the other surface thereof L' facing the center of the light emitting chip 100 may be about 10 to 16 μm. In this case, the light emitting stacked structure may be formed to be relatively thick and have more stable structure, and in particular, the first LED stack 20 may have a thickness of about 4 μm to about 5 μm, the second LED stack 30 may have a thickness of about 3 μm, the third LED stack 40 may have a thickness of about 3 μm, and the first and second adhesive layers may each have a thickness of about 3 μm, without being limited thereto. According to yet another exemplary embodiment, the different in length between one side surface of the connection electrode L facing the outside and the other surface thereof L' facing the center of the light emitting chip 100 may be about 25% of the length of the longest side surface. However, the inventive concepts are not limited to a particular difference in length between the opposing surfaces of the connection electrodes, and the difference in length between the opposing surfaces of the connection electrodes may be varied.

In some exemplary embodiments, at least one of the connection electrodes 20ce, 30ce, 40ce, and 50ce may overlap a side surface of each of the light emitting stacks 20, 30, and 40, thereby balancing the temperature between each of the light emitting stacks 20, 30, and 40, and efficiently dissipate the internally generated heat to the outside. In addition, when the connection electrodes 20ce, 30ce, 40ce, and 50ce include a reflective material, such as metal, the connection electrodes 20ce, 30ce, 40ce, and 50ce may reflect light emitted from at least one or more light emitting stacks 20, 30, and 40, thereby improving light efficacy.

A method of forming the first, second, third, and fourth connection electrodes 20ce, 30ce, 40ce, and 50ce is not particularly limited. For example, according to an exemplary embodiment, a seed layer may be deposited on the light emitting stacked structure as a conductive surface, and the seed layer may be patterned by using a photo-lithography or the like, such that the seed layer is disposed at desired locations where the connection electrodes are to be formed. Then, the seed layer may be plated with metal, such as Cu, Ni, Ti, Sb, Zn, Mo, Co, Sn, Ag, or an alloy thereof, and the seed layer may be removed. In some exemplary embodiments, an additional metal may be deposited or plated on the plated metal (e.g., the connection electrodes), by an electroless nickel immersion gold (ENIG) or the like, to prevent or at least suppress oxidation of the plated metal. In some exemplary embodiments, the seed layer may remain in each connection electrode.

According to an exemplary embodiment, when the bump electrodes 20bp, 30bp, 40bp, and 50bp are omitted from the contact parts 20C, 30C, 40C, and 50C, the pads 20pd, 30pd, 40pd, and 50pd may be connected to the respective connection electrodes 20ce, 30ce, 40ce, and 50ce. For example, after the through-holes 20ct, 30ct, 40ct, and 50ct are formed to partially expose the pads 20pd, 30pd, 40pd, and 50pd of the contact parts 20C, 30C, 40C, and 50C, a seed layer may be deposited on the light emitting stacked structure as a conductive surface, and the seed layer may be patterned by using a photo-lithography or the like, such that the seed layer is disposed at desired locations where the connection electrodes are to be formed. In this case, the seed layer may overlap at least a portion of each pad 20pd, 30pd, 40pd, and 50pd. According to an exemplary embodiment, the seed layer may be deposited to a thickness of about 1000 Å, without being limited thereto. Then, the seed layer may be plated with metal, such as Cu, Ni, Ti, Sb, Zn, Mo, Co, Sn, Ag, or an alloy thereof, and the seed layer may be removed. In some exemplary embodiments, an additional metal may be deposited or plated on the plated metal (e.g., the connection electrodes), by an electroless nickel immersion gold (ENIG) or the like, to prevent or at least suppress oxidation of the plated metal. In some exemplary embodiments, the seed layer may remain in each connection electrode.

FIGS. 10, 11, 12, 13, and 14 are schematic cross-sectional views illustrating a process of manufacturing the light emitting package of FIG. 1 according to an exemplary embodiment.

Figure 10:
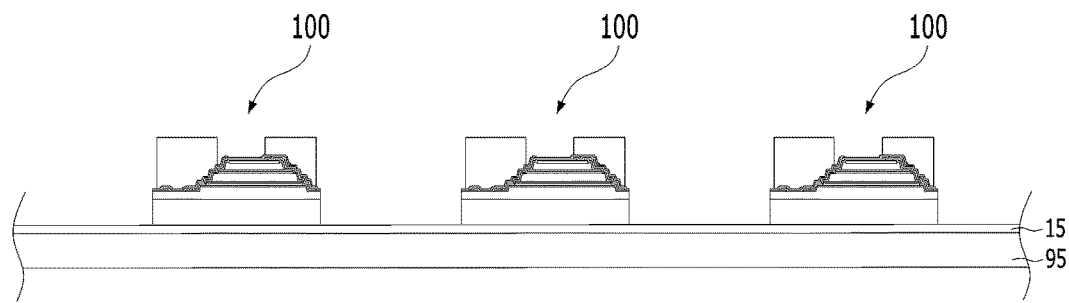
FIGS. 10, 11, 12, 13, and 14 are schematic cross-sectional views illustrating a process of manufacturing the light emitting package of FIG. 1 according to an exemplary embodiment.

Referring to FIG. 10, an array of the light emitting chips 100 formed on the substrate 11 may be separated from each other, and be transferred to a carrier substrate 95 at a desired pitch. For example, in some exemplary embodiments, the light emitting chips 100 may be transferred at a pitch that conforms to that of electrodes of a target device, such as a display device.

Figure 11:
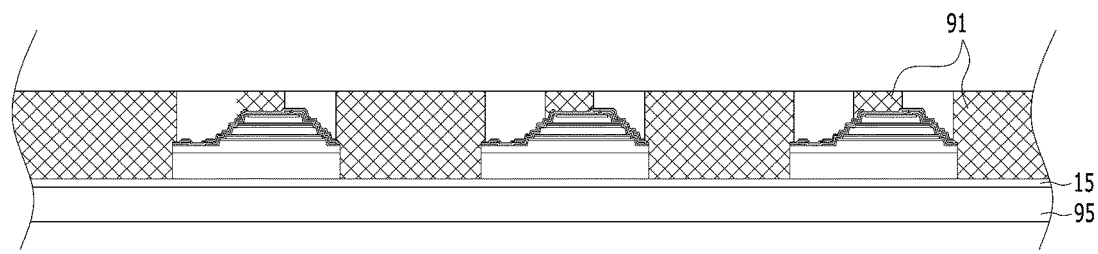

According to an exemplary embodiment, the singularized light emitting chips 100 may be transferred to a carrier substrate 95 by an adhesive layer 15 interposed therebetween. The carrier substrate 95 is not particularly limited, as long as the carrier substrate 95 stably mounts the light emitting chips 100 thereon with the adhesive layer 15 therebetween. The adhesive layer 15 may be a tape, but the inventive concepts are not limited thereto, as long as the adhesive layer 15 stably attaches the light emitting chips 100 to the carrier substrate 95 while being capable of detaching the light emitting chips 100 during subsequent processes. Once the light emitting chips 100 are mounted on the carrier substrate 95, the molding layer 91 may be formed to cover at least the sides of the light emitting chips 100, as shown in FIG. 11. According to an exemplary embodiment, the molding layer 91 may transmit a portion of light emitted from the light emitting chip 100, and may also reflect, diffract, and/or absorb a portion of external light to prevent the external light from being reflected by the light emitting chip 100 towards a direction that may be visible to a user. The molding layer 91 may cover at least the sides the light emitting chip 100 to protect the light emitting chip 100 from external moisture and stress, and to reinforce the structural configuration of the light emitting package to facilitate subsequent transfer and/or mounting processes.

The molding layer 91 may be formed between the connection electrodes 20ce, 30ce, 40ce, and 50ce to cover a portion of the first light emitting stack 20 (e.g., a top structure of the light emitting stacked structure) disposed between the connection electrodes 20ce, 30ce, 40ce, and 50ce. In this manner, the molding layer 91 may protect the light emitting structure from an external impact that may be applied during subsequent processes, as well as providing a sufficient contact area to the light emitting chip 100 to facilitate its handling during subsequent transferring steps. In addition, the molding layer 91 may prevent leakage of light towards a side surface of the light emitting chip 100, so as to prevent or at least suppress interference of light emitted from adjacent light emitting chips 100.

According to an exemplary embodiment, an upper surface of the molding layer 91 may be substantially flush with top surfaces of the connection electrodes 20ce, 30ce, 40ce, and 50ce by a polishing process or the like. The molding layer 91 according to an exemplary embodiment may include an epoxy molding compound (EMC), which may be formed to have various colors, such as black or transparent, without being limited thereto. For example, in some exemplary embodiments, the molding layer 91 may include a polyimide dry film (PID) that has photosensitivity.

The molding layer 91 may be formed through various methods known in the art, such as lamination, plating, and/or printing methods. For example, the molding layer 91 may be formed by a vacuum laminate process, in which an organic polymer sheet is disposed on the light emitting chip 100, and high temperature and pressure are applied in vacuum, to improve light uniformity by providing a substantially planar top surface of the light emitting package.

Figure 12:
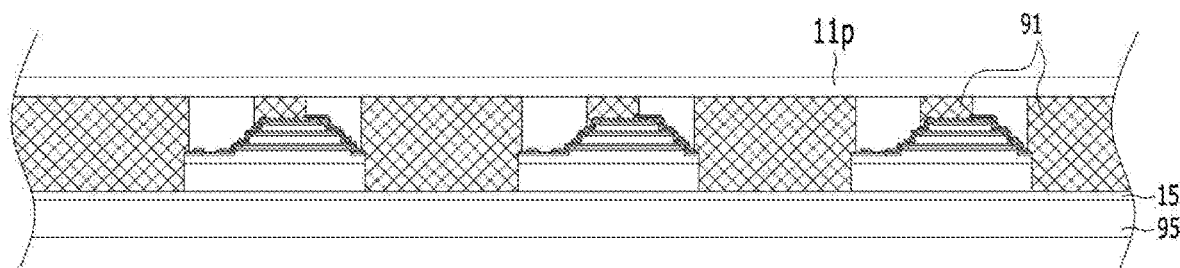

Referring to FIG. 12, the insulation layer 11p may be formed on substantially the entire molding layer 91 and the light emitting chips 100. The insulation layer 11p may include an organic insulating material or an inorganic insulating material, such as $SiO_2$ or $SiO_x$.

Figure 13:
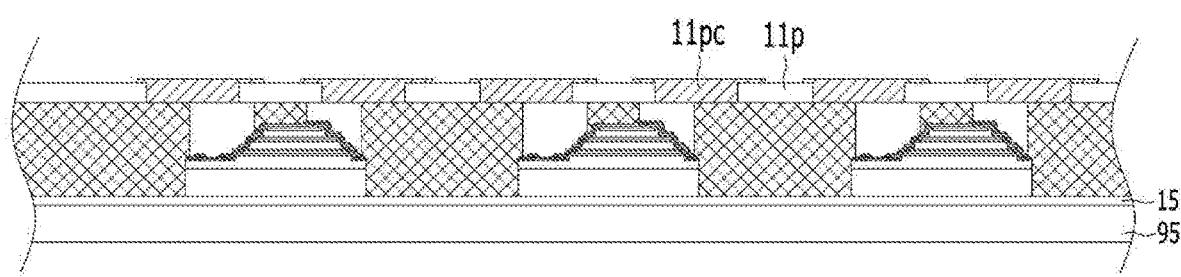

Referring to FIG. 13, openings may be formed in the insulation layer 11p. The openings may overlap at least a portion of each of the first, second, third, and fourth connection electrodes 20ce, 30ce, 40ce, and 50ce of the light emitting chips 100. Then, a conductive layer may be formed on the insulation layer 11p and patterned to form lead electrodes 11pc. The lead electrodes 11pc may be formed through a photo-lithography process, without being limited thereto. As the openings of the insulation layer 11p overlap at least a portion of each of the first, second, third, and fourth connection electrodes 20ce, 30ce, 40ce, and 50ce, and as the conductive layer forming the lead electrodes 11pc substantially fill the openings, the lead electrodes 11pc may be electrically connected to each of the first, second, third, and fourth connection electrodes 20ce, 30ce, 40ce, and 50ce, respectively. The lead electrodes 11pc may be spaced apart from each other to be insulated from each other, and extend outwardly from the light emitting chip 100 to a desired extent to provide a fan-out structure. In this manner, the light emitting package 110 including the light emitting chip 100 and the lead electrodes 11pc may be easily mounted to a circuit board or the like even when the size of the light emitting chip 100 is very small. In some exemplary embodiments, the lead electrodes 11pc may include metal, such as Cu, Ni, Ti, Sb, Zn, Mo, Co, Sn, Ag, or an alloy thereof, without being limited thereto. In some exemplary embodiments, the lead electrodes 11pc may be surface treated by ENIG, to facilitate electrical connection to the connection electrodes of the light emitting chip 100 by being partially melt at high temperature.

Figure 14:
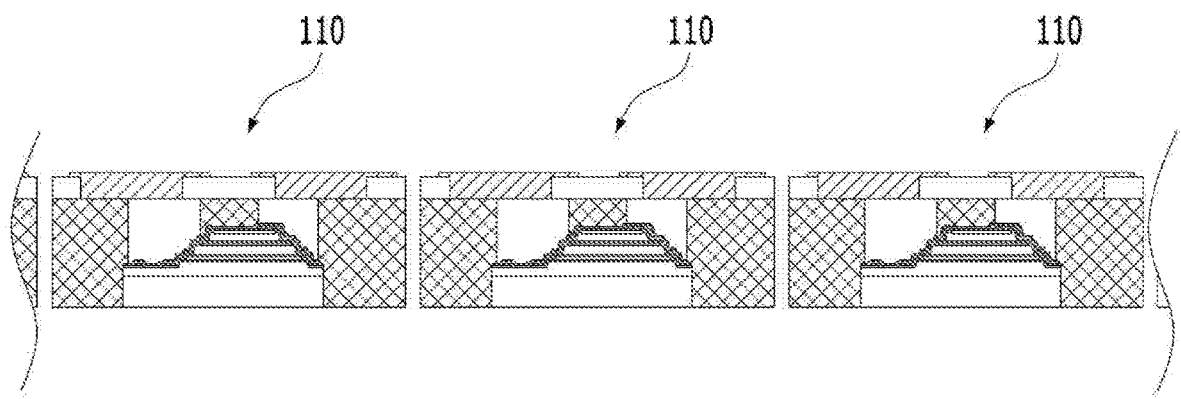

Referring to FIG. 14, the adhesive layer 15 and the carrier substrate 95 may be removed from the light emitting chips 100 disposed with the insulation layer 11p. Then the light emitting chips 100 including the lead electrodes 11pc may be cut in a desired configuration to be formed as the light emitting package 110. For example, the light emitting package 110 (or a light emitting module) shown in FIG. 15 includes 4 light emitting chips 100 (2×2) disposed on the insulation layer 11p. However, the inventive concepts are not limited to a particular number of light emitting chips formed in the light emitting package 110. For example, in some exemplary embodiments, the light emitting package 110 may include one or more light emitting chips 100 formed on the insulation layer 11p. In addition, the inventive concepts are not limited to a particular arrangement of one or more light emitting chips 100 in the light emitting package 110. For example, one or more light emitting chips 100 in the light emitting package 110 may be arranged in n×m arrangement, where n and m are natural numbers.

According to an exemplary embodiment, the lead electrodes 11pc of the light emitting package 110 may be spaced apart from each other at a predetermined pitch P that corresponds to a pitch of the electrodes of the target device, such as a circuit board. For example, the pitch P between the lead electrodes 11pc may be greater than a pitch P' between adjacent connection electrodes of the light emitting chip 100. In this manner, the light emitting package 110 may be easily mounted on a target substrate or a circuit board, even if the layout of its electrodes of the circuit board was designed for a conventional light emitting device.

According to an exemplary embodiment, the lead electrodes 11pc of the light emitting package 110 may be coupled to the electrodes of a circuit board or the like by an anisotropic conductive film (ACF) bonding, for example. ACF bonding may be processed at a lower temperature than in other bonding methods, and thus, when the lead electrodes 11pc are electrically coupled to the electrodes of the circuit board or the like through ACF bonding, the light emitting chips 100 may be protected from being exposed to a high temperature during bonding. However, the inventive concepts are not limited to a particular bonding method. For example, in some exemplary embodiments, the light emitting package 110 may be bonded to the electrodes of the circuit board or the like using an anisotropic conductive paste (ACP), solder, ball grid area (BGA), or micro bumps including at least one of Cu and Sn. In this case, since the lead electrodes 11pc provide a wider contact area than the connection electrodes 20ce, 30ce, 40ce, and 50ce, coupling process between the light emitting package 110 and the circuit board or the like may be facilitated even when the size of the light emitting package 110 is very small.

Figure 16:
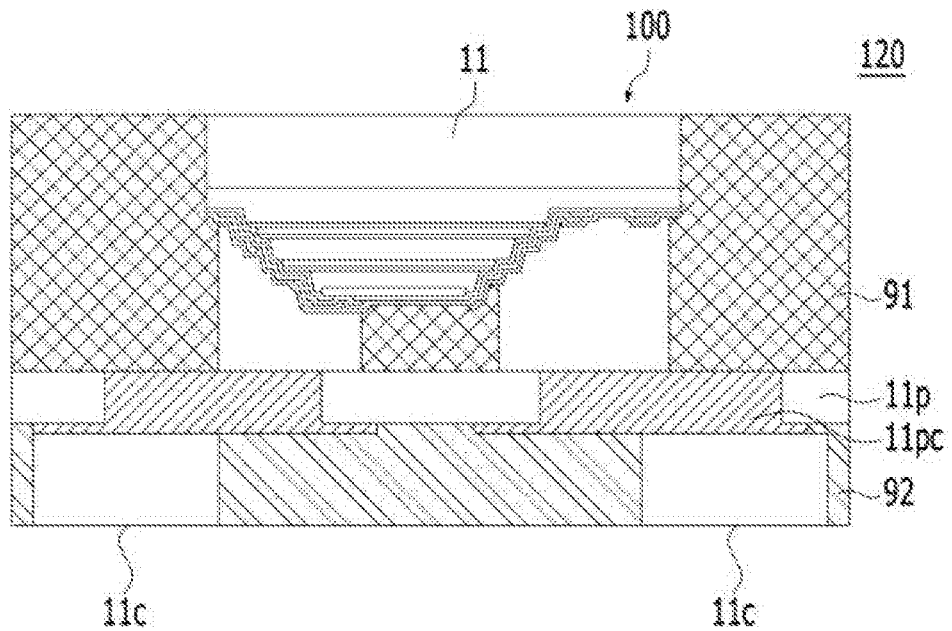
FIG. 16 is a schematic cross-sectional view of a light emitting package according to another exemplary embodiment.
Figure 17:
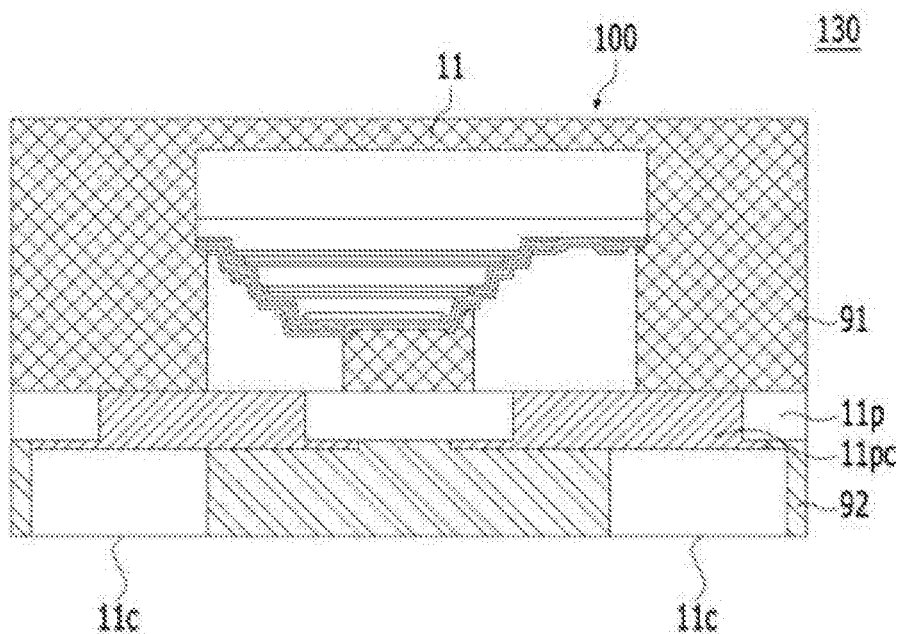
FIG. 17 is a schematic cross-sectional view of a light emitting package according to yet another exemplary embodiment.

FIG. 16 is a schematic cross-sectional view of a light emitting package according to another exemplary embodiment, and FIG. 17 is a schematic cross-sectional view of a light emitting package according to another exemplary embodiment.

Referring to FIG. 16, a light emitting package 120 according to an exemplary embodiment is substantially the same as the light emitting package 110 of FIG. 1, except that the light emitting package 120 further includes extension electrodes 11c and a second molding layer 92. According to an exemplary embodiment, a plurality of extension electrodes 11c may be formed on the lead electrodes 11pc disposed on the insulation layer 11p, respectively, which are electrically connected to the connection electrodes 20ce, 30ce, 40ce, and 50ce of the light emitting chip 100, respectively.

The extension electrodes 11c may be separated from each other and generally have a substantially elongated shape, however, the inventive concepts are not limited to one particular shape of the extension electrodes 11c. The extension electrode 11c according to an exemplary embodiment may include metal, such as Cu, Ni, Ti, Sb, Zn, Mo, Co, Sn, Ag, or an alloy thereof, without being limited thereto. For example, the extension electrode 11c may include two or more metals or a plurality of different metal layers to reduce the stress applied thereto from the elongated shape thereof In some exemplary embodiments, when the extension electrode 11c includes Cu, an additional metal may be deposited or plated thereon to suppress oxidation of Cu. In some exemplary embodiments, when the extension electrode 11c includes Cu/Ni/Sn, Cu may prevent Sn from being infiltrating into the light emitting stacked structure. The extension electrode 11c may be formed by a metal plating process, without being limited thereto.

According to the illustrated exemplary embodiment, each of the extension electrodes 11c may be formed near a distal end of the lead electrode 11pc that faces away the light emitting chip 100. In this manner, the extension electrodes 11c may structurally support the light emitting package 120, as the extension electrodes 11c are formed near each corner of the light emitting package 120. In some exemplary embodiments, the extension electrodes 11c may not overlap the connection electrodes 20ce, 30ce, 40ce, and 50ce to further improve structural reliability.

The second molding layer 92 may be formed on insulation layer 11p and surround at least the sides the extension electrodes 11c. The second molding layer 92 may include an organic or an inorganic polymer. In some exemplary embodiments, at least one of the first and second molding layers 91 and 92 may additionally include pillars, such as silica or alumina. In some exemplary embodiments, the second molding layer 92 may be formed through various methods known in the art, such as lamination, plating, and/or printing methods. For example, the second molding layer 92 may be formed by a vacuum laminate process, in which an organic polymer sheet is disposed on the light emitting chip 100, and high temperature and pressure are applied in vacuum, to improve light uniformity by providing a substantially planar top surface of the light emitting package. In this manner, the light emitting package 120 may provide a reinforced package structure. In some exemplary embodiments, the first and second molding layers 91 and 92 may include substantially the same material or different materials from each other.

Figure 15:
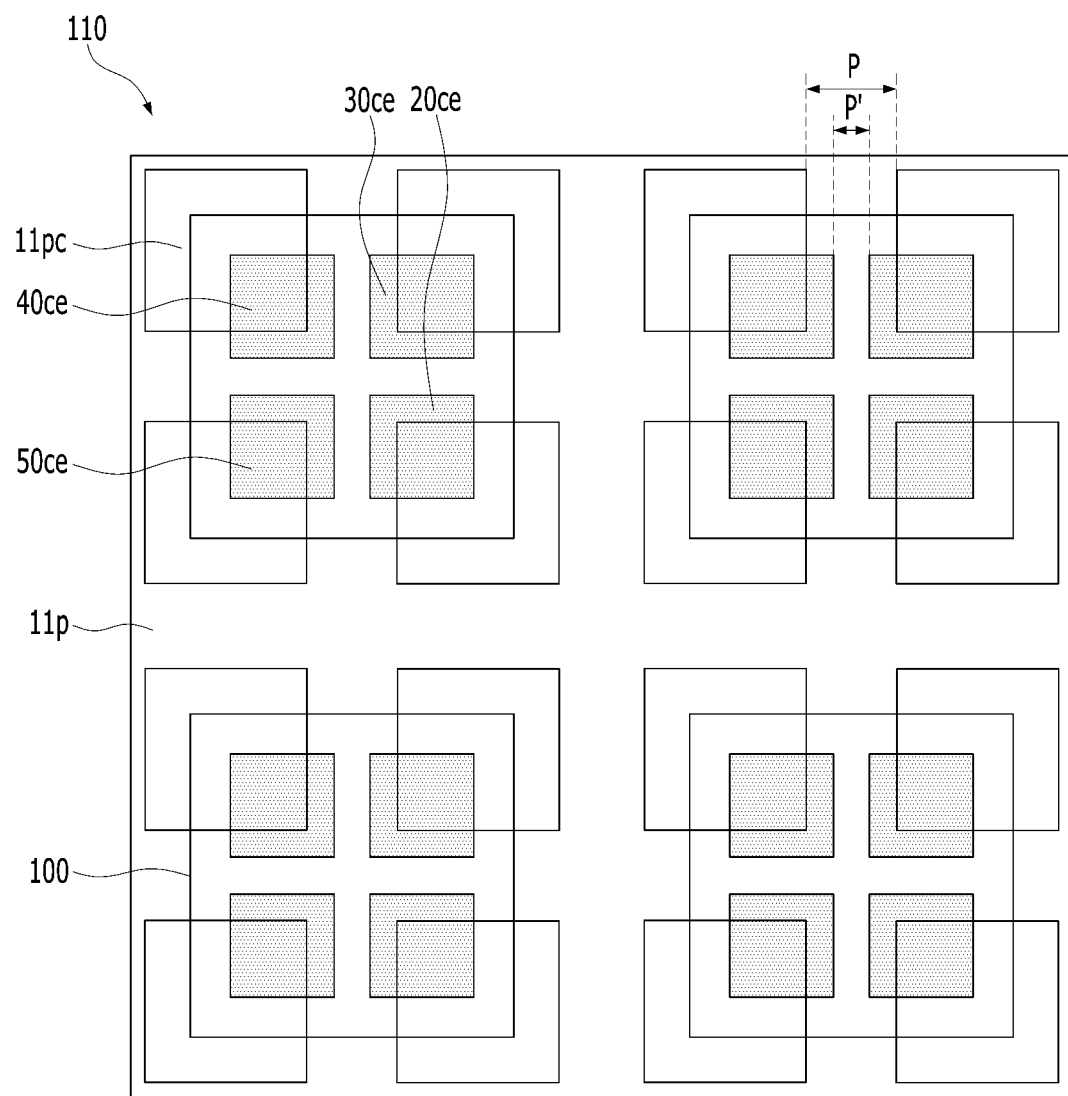
FIG. 15 is a schematic bottom view of a light emitting module according to an exemplary embodiment showing underlying structures.

Referring to FIG. 17, a light emitting package 130 according to an exemplary embodiment is substantially the same as the light emitting package 120 of FIG. 15, except that the first molding layer 91 is formed over the substrate 11 of the light emitting chip 100, to prevent external light from being reflected by the substrate 11 towards a direction that can be seen by a user. In this case, in some exemplary embodiments, a portion of the first molding layer 91 covering a top surface of the substrate 11 facing away the insulation layer 11p may have a thickness less than about 100 µm to at least transmit 50% of light emitted from the light emitting chip 100.

Figure 18:
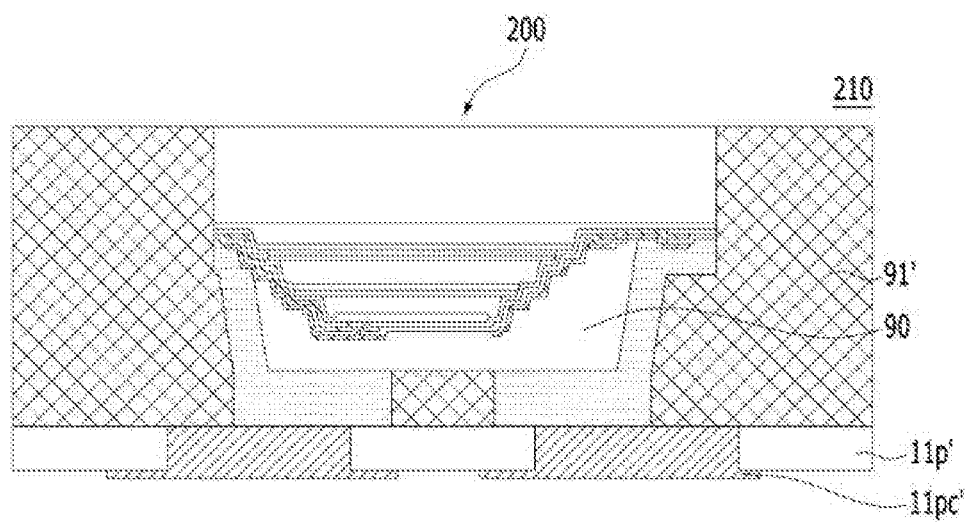
FIG. 18 is a schematic cross-sectional view of a light emitting package constructed according to another exemplary embodiment of the invention.

FIG. 18 is a schematic cross-sectional view of a light emitting package constructed according to another exemplary embodiment of the invention.

Referring to FIG. 17, the light emitting package 210 according to an exemplary embodiment includes a light emitting chip 200, the insulation layer 11p', lead electrodes 11pc', and the first molding layer 91' surrounding at least the sides of the light emitting chip 200. The light emitting package 210 is substantially the same as the light emitting package 110 of FIG. 1, except the shape of the connection electrodes and that the light emitting chip 200 includes a passivation layer 90 formed between the connection electrodes, which will be described in more detail below. The insulation layer 11p' and the lead electrodes 11pc' are substantially the same as the insulation layer 11p and the lead electrodes 11pc described above, and thus, repeated descriptions thereof will be omitted to avoid redundancy.

According to an exemplary embodiment, the lead electrodes 11pc' of the light emitting package 110 may be spaced apart from each other at a predetermined pitch that corresponds to a pitch of the electrodes of a target device, such as a circuit board. In this manner, the light emitting package 210 may be easily mounted on a target substrate or a circuit board of a final device, such as a display device, even if the layout of its electrodes of the circuit board was designed for a conventional light emitting device.

Figure 19A:
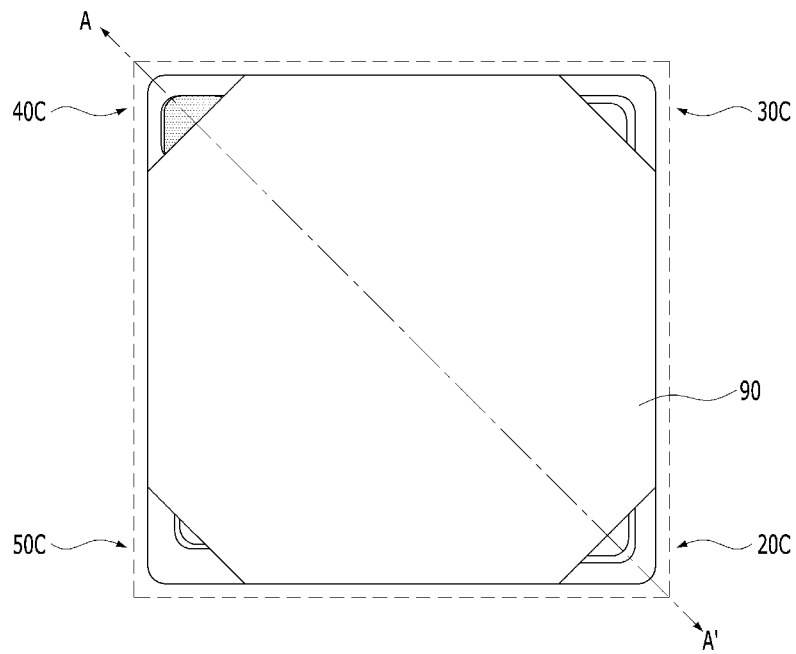
FIGS. 19A and 20A are plan views illustrating a process of manufacturing a light emitting chip according to another exemplary embodiment.
Figure 19B:
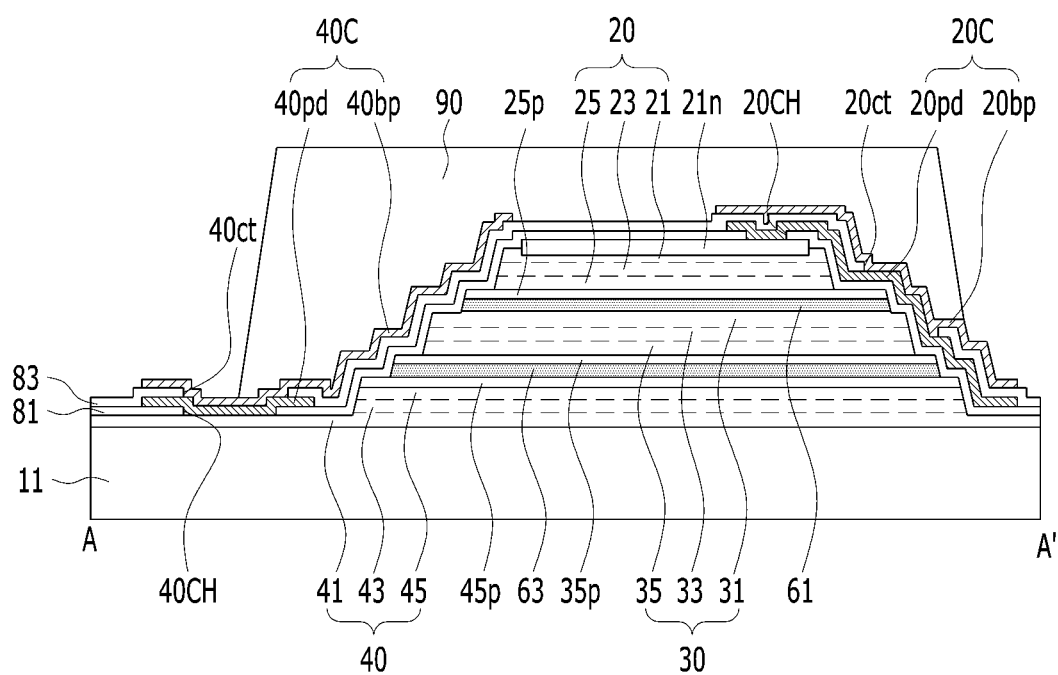
FIGS. 19B and 20B are cross-sectional views taken along line A-A' of its corresponding plan view shown in FIGS. 19A and 20A according to another exemplary embodiment.
Figure 20A:
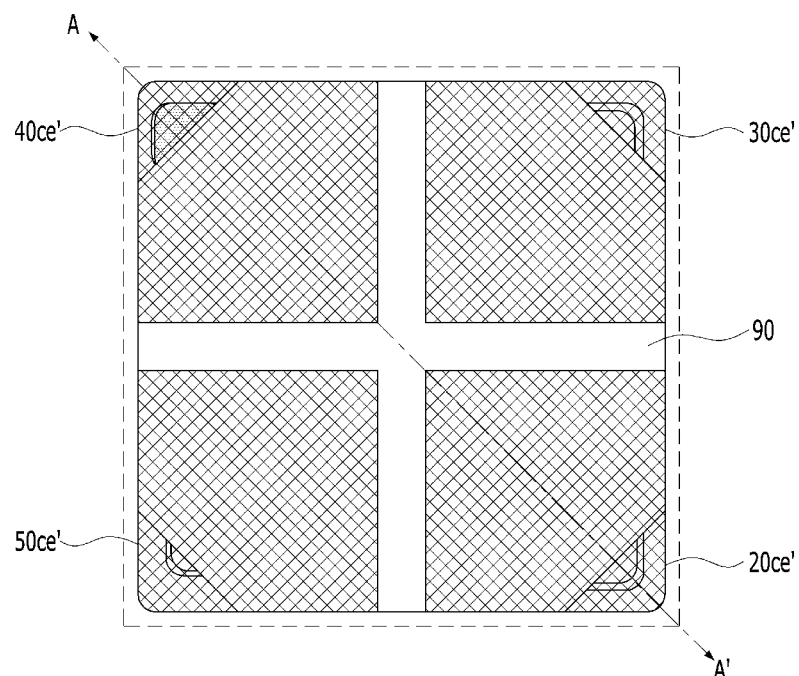
Figure 20B:
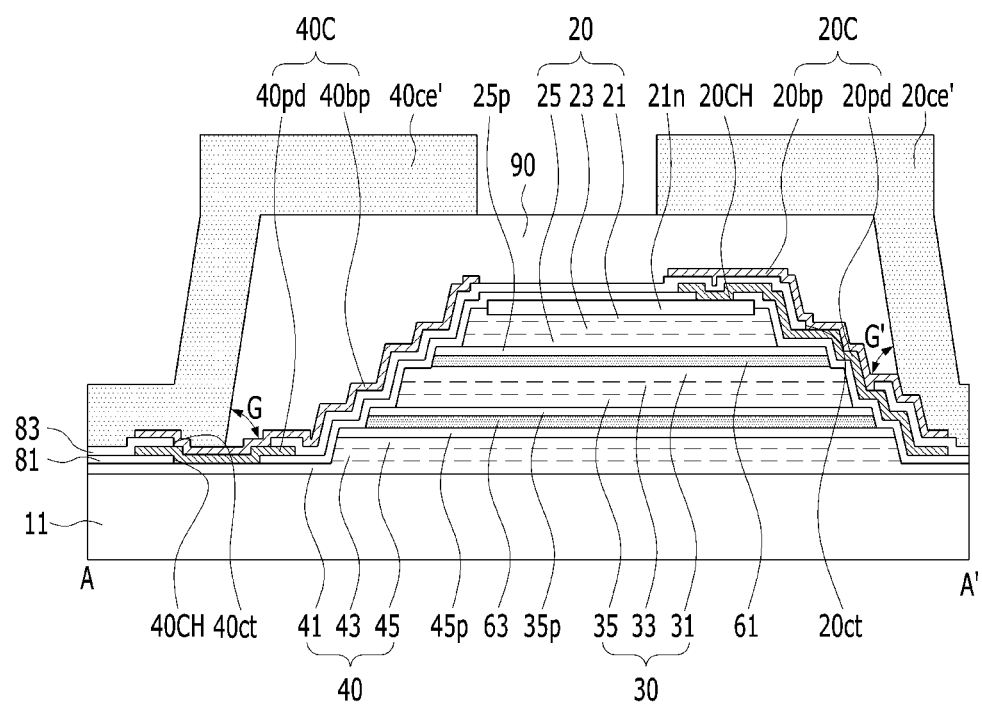

FIGS. 19A and 20A are plan views illustrating a process of manufacturing a light emitting chip according to another exemplary embodiment. FIGS. 19B and 20B are cross-sectional views taken along line A-A' of its corresponding plan view shown in FIGS. 19A and 20A according to another exemplary embodiment.

Referring to FIGS. 19A and 19B, a light emitting chip 200 according to an exemplary embodiment includes a light emitting stacked structure, connection electrodes 20ce', 30ce', 40ce', and 50ce' (see FIGS. 20A and 20B), and a passivation layer 90 formed on the light emitting stacked structure. The light emitting stacked structure has a configuration substantially similar to that shown in FIGS. 8A and 8B. However, according to the illustrated exemplary embodiment, the passivation layer 90 may be formed to cover at least a portion of an upper surface of the light emitting stacked structure shown in FIGS. 8A and 8B. More particularly, as shown in FIG. 20B, the passivation layer 90 may cover at least a portion of an upper surface of the first light emitting stack 20 disposed on the top of the stacked structure, to protect the light emitting stacked structure from external stress during manufacture.

According to the illustrated exemplary embodiment, the passivation layer 90 may form an inclined angle with respect to the substrate 11. For example, the angle G and G' (see FIG. 20B) formed between the passivation layer 90 and the substrate 11 may be less than about 80°. When the inclined angle G and G' is greater than about 80°, the passivation layer 90 may not sufficiently cover steps formed on side surfaces of the light emitting stacked structure. In some exemplary embodiments, the inclined angle G and G' between the passivation layer 90 and the substrate 11 may be greater than about 60° and less than about 70°. In this manner, the connection electrodes 20ce', 30ce', 40ce', and 50ce' (see FIGS. 20A and 20B) to be formed on the passivation layer 90 may also be stably formed on the light emitting stacked structure. In some exemplary embodiments, an edge formed between a top surface and a side surface of the passivation layer 90 may form a smooth angle, such that the connection electrodes 20ce', 30ce', 40ce', and 50ce' to be formed thereon may have a substantially uniform thickness. However, the inventive concepts are not limited to, and in some exemplary embodiments, a substantially sharp edge may be formed between a top surface and a side surface of the passivation layer 90.

Referring to FIGS. 20A and 20B, according to the illustrated exemplary embodiment, the first, second, third, and fourth connection electrodes 20ce', 30ce', 40ce', and 50ce' spaced apart from each other are formed on the passivation layer 90. As described above, the first, second, third, and fourth connection electrodes 20ce', 30ce', 40ce', and 50ce' may be electrically connected to the first, second, third, and fourth bump electrodes 20bp, 30bp, 40bp, and 50bp, respectively, as in the first, second, third, and fourth connection electrodes 20ce, 30ce, 40ce, and 50ce of the light emitting chip 100, to transmit an external signal to each of the light emitting stacks 20, 30, and 40. More particularly, the first connection electrode 20ce' may be connected to the first bump electrode 20bp, which is connected to the first upper contact electrode 21n through the first pad 20pd, to be electrically connected to the first-type semiconductor layer 21 of the first light emitting stack 20. The second connection electrode 30ce' may be connected to the second bump electrode 30bp, which is connected to the second pad 30pd, to be electrically connected to the first-type semiconductor layer 31 of the second light emitting stack 30. The third connection electrode 40ce' may be connected to the third bump electrode 40bp, which is connected to the third pad 40pd, to be electrically connected to the first-type semiconductor layer 41 of the third light emitting stack 40. The fourth connection electrode 50ce' may be connected to the fourth bump electrode 50bp, which is connected to the fourth pad 50pd, to be electrically connected to the second-type semiconductor layers 25, 35, and 45 of the light emitting stacks 20, 30, and 40 via the first, second, and third lower contact electrodes 25p, 35p, and 45p, respectively.

A method of forming the first, second, third, and fourth connection electrodes 20ce', 30ce', 40ce', and 50ce' is not particularly limited. For example, according to an exemplary embodiment, a conductive layer may be deposited on the passivation layer 90, and the conductive layer may be patterned by using a photo-lithography or the like, such that each of the conductive layers overlaps a portion of the first bump electrode 20bp, second bump electrode 30bp, third bump electrode 40bp, and fourth bump electrode 50bp exposed by the passivation layer 90, respectively. The conductive layer (e.g., connection electrodes) according to an exemplary embodiment may include metal, such as Cu, Ni, Ti, Sb, Zn, Mo, Co, Sn, Ag, or an alloy thereof. In this case, a separate plating process may be omitted. In some exemplary embodiments, an additional metal may be deposited on the conductive layer, by an electroless nickel immersion gold (ENIG) or the like, to prevent or at least suppress oxidation of the connection electrodes 20ce', 30ce', 40ce', and 50ce'.

According to the illustrated exemplary embodiment, each of the connection electrodes 20ce', 30ce', 40ce', and 50ce' may have a curved shape that protrudes away from the substrate 11 to substantially cover the light emitting stacked structure and the passivation layer 90. As shown in the drawings, each of the connection electrodes 20ce', 30ce', 40ce', and 50ce' may have a substantially flat upper surface to facilitate an electrical connection between the light emitting stacked structure and external lines or electrodes, as well as to increase the adhesiveness of the light emitting chip 200 to other elements, such as a PCB, during subsequent boding and transferring steps. The connection electrodes 20ce', 30ce', 40ce', and 50ce' according to the illustrated exemplary embodiment may surround the at least a portion of each light emitting stack 20, 30, and 40 to protect the light emitting stacked structure, such that the light emitting chip 200 has a more stable structure that can withstand various subsequent processes along with the passivation layer 90. For example, the connection electrodes 20ce', 30ce', 40ce', and 50ce' that substantially surround the light emitting stacked structure may absorb at least a part of the stress that would otherwise be applied directly to the light emitting stacked structure, thereby protecting the light emitting chip during manufacture.

According to the illustrated exemplary embodiment, the third connection electrode 40ce is shown as being asymmetrical to the first connection electrode 20ce. More particularly, each of the connection electrodes 20ce', 30ce', 40ce', and 50ce' may have a portion that does not overlap the passivation layer 90, and FIG. 20B, for example, shows that a portion of the third connection electrode 40ce' not overlapping the passivation layer 90 is greater in area than that of the first connection electrode 20ce' near two opposing ends of the substrate 11. However, the inventive concepts are not limited thereto, and in some exemplary embodiments, each of the connection electrodes 20ce', 30ce', 40ce', and 50ce' may be symmetrical to each other. For example, a portion of each of the connection electrodes 20ce', 30ce', 40ce', and 50ce' that does not overlap the passivation layer 90 may have the same area as each other.

Although the drawings show that the passivation layer 90 is not formed between the portions of the connection electrodes 20ce', 30ce', 40ce', and 50ce' that are disposed on a top surface of the passivation layer 90, the inventive concepts are not limited thereto. For example, in some exemplary embodiments, the passivation layer 90 may be formed between the connection electrodes 20ce', 30ce', 40ce', and 50ce', such that the upper surface of the passivation layer 90 may be substantially flush with the upper surfaces of the connection electrodes 20ce', 30ce', 40ce', and 50ce'. In this manner, the adhesiveness of the light emitting chip 200 to the PCB or the like may be further strengthened during subsequent processes. A portion of the passivation layer 90 that is disposed between the connection electrodes 20ce', 30ce', 40ce', and 50ce' may be formed before or after forming the connection electrodes 20ce', 30ce', 40ce', and 50ce'. Since the constituent elements of the light emitting chip 200 according to the illustrated exemplary embodiment are substantially the same as those of the light emitting chip 100 described above, repeated descriptions of the substantially the same elements will be omitted to avoid redundancy.

Figure 21:
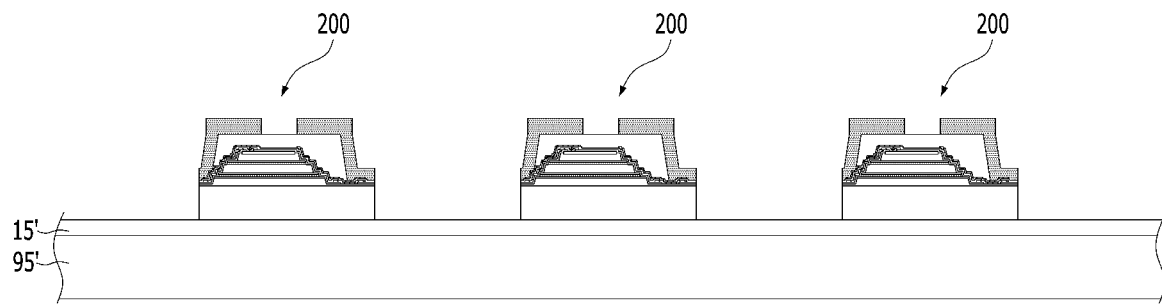
FIGS. 21 and 22 are schematic cross-sectional views illustrating a process of manufacturing the light emitting package of FIG. 18 according to another exemplary embodiment.
Figure 22:
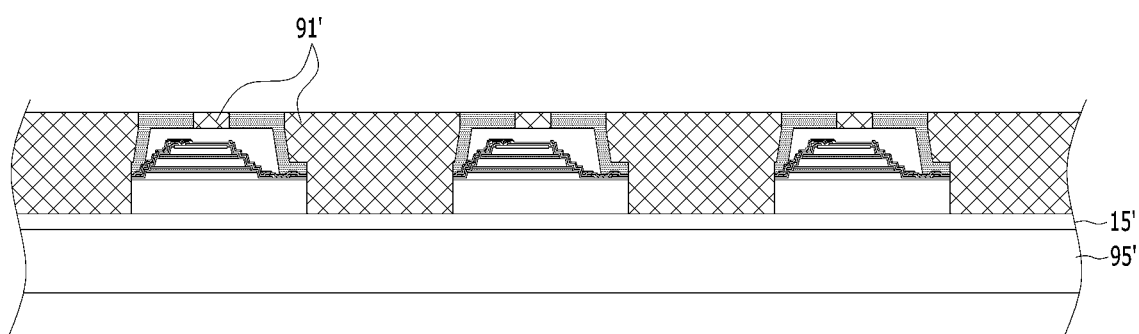

FIGS. 21 and 22 are schematic cross-sectional views illustrating a process of manufacturing a light emitting package according to another exemplary embodiment.

Referring to FIG. 21, an array of the light emitting chips 200 formed on the substrate 11 may be separated from each other, and be transferred to a carrier substrate 95' at a desired pitch. For example, in some exemplary embodiments, the light emitting chips 200 may be transferred at a pitch that conforms to that of electrodes of a target device, such as a circuit board of a display device.

According to an exemplary embodiment, the singularized light emitting chips 200 may be mounted on the carrier substrate 95' by an adhesive layer 15' interposed therebetween. The carrier substrate 95' and the adhesive layer 15' are not particularly limited, and may be substantially the same as the carrier substrate 95 and the adhesive layer 15 described above with reference to FIG. 10, respectively.

Referring to FIG. 22, once the light emitting chips 200 are mounted on the carrier substrate 95', a molding layer 91'(or a first molding layer) may be formed to substantially cover the light emitting chips 200. According to an exemplary embodiment, the molding layer 91' may transmit a portion of light emitted from the light emitting chip 200, and may also reflect, diffract, and/or absorb a portion of external light to prevent the external light from being reflected by the light emitting chip 200 towards a direction that may be visible to a user. The molding layer 91' may substantially cover the light emitting chip 200 to protect the light emitting chip 200 from external moisture and stress, and reinforce the structural configuration of the light emitting package to facilitate subsequent transfer and/or mounting processes.

According to the illustrated exemplary embodiment, the molding layer 91' may be formed between the connection electrodes 20ce', 30ce', 40ce', and 50ce' of the light emitting chip 200, and cover at least a portion of the passivation layer 90. The molding layer 91' according to an exemplary embodiment may include an epoxy molding compound (EMC), which may be formed to have various colors, such as black or transparent, without being limited thereto. For example, in some exemplary embodiments, the molding layer 91' may include a polyimide dry film (PID) that has photosensitivity. The molding layer 91' may be formed through various methods known in the art, such as lamination, plating, and/or printing methods. For example, the molding layer 91' may be formed by a vacuum laminate process, in which an organic polymer sheet is disposed on the light emitting chip 200, and high temperature and pressure are applied in vacuum, to improve light uniformity by providing a substantially planar top surface of the light emitting package. In some exemplary embodiments, the molding layer 91' and the passivation layer 90 may include substantially the same material or different materials from each other.

Referring back to FIG. 18, the light emitting chip 200 substantially covered with the molding layer 91' may be disposed on the insulation layer 11p', and an array of the light emitting chips 200 formed on the substrate 11 may be singularized by various known methods in the art, thereby providing the light emitting package 210 of FIG. 18.

Figure 23:
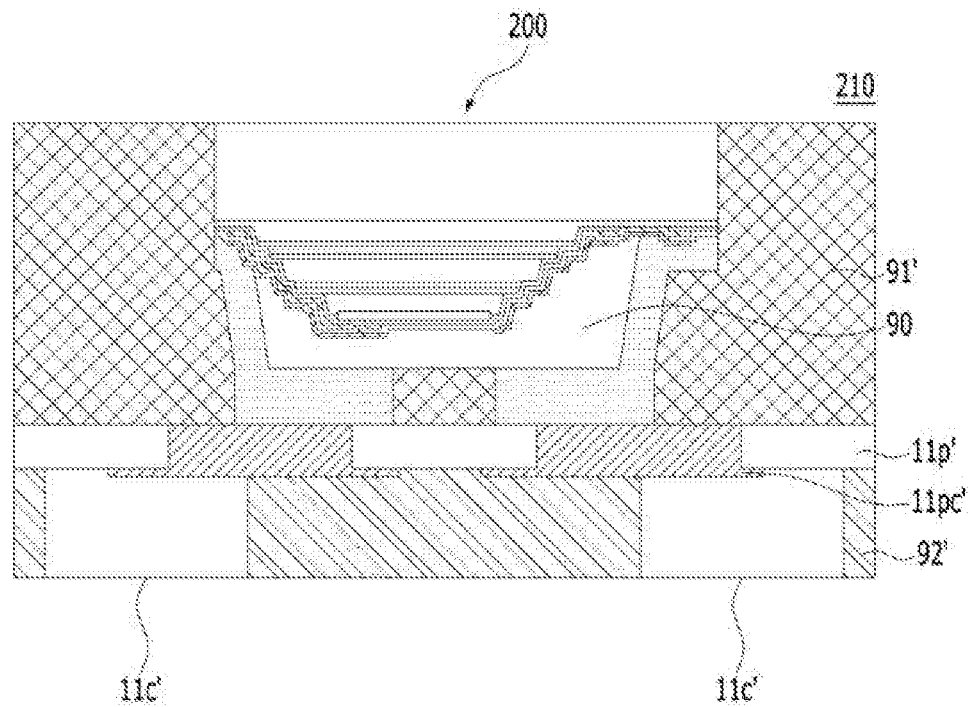
FIG. 23 is a schematic cross-sectional view of a light emitting package according to yet another exemplary embodiment.
Figure 24:
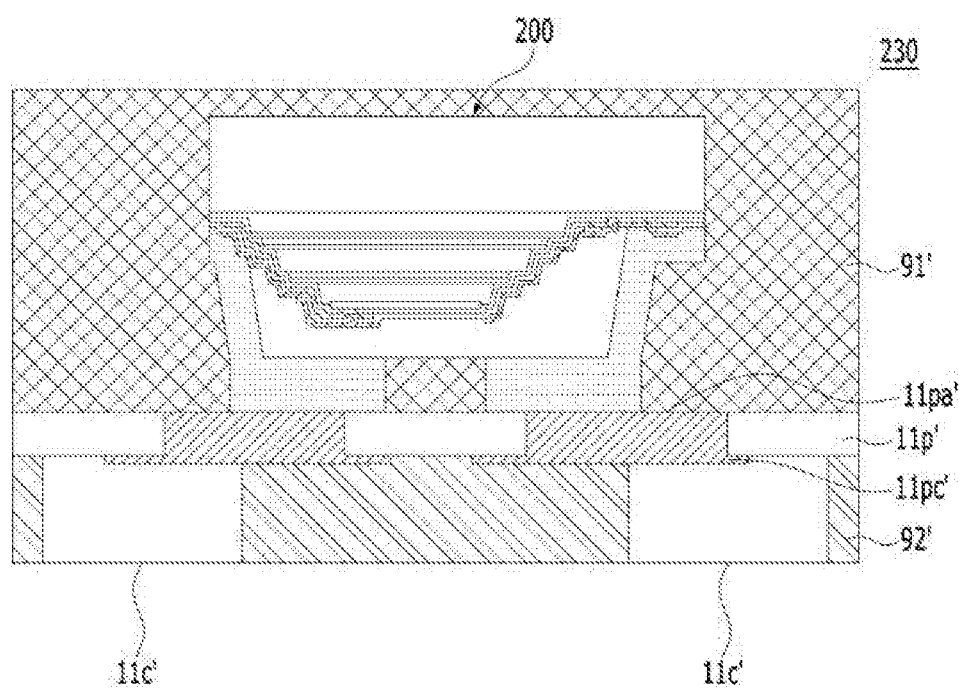
FIG. 24 is a schematic cross-sectional view of a light emitting package according to still another exemplary embodiment.

FIG. 23 is a schematic cross-sectional view of a light emitting package according to yet another exemplary embodiment, and FIG. 24 is a schematic cross-sectional view of a light emitting package according to still another exemplary embodiment Referring to FIG. 23, a light emitting package 220 according to the illustrated exemplary embodiment is substantially the same as the light emitting package 210 of FIG. 18, except that the light emitting package 220 further includes extension electrodes 11c' and a second molding layer 92'. According to an exemplary embodiment, a plurality of extension electrodes 11c' may be formed on the lead electrodes 11pc' disposed on the insulation layer 11p', respectively, and be electrically connected to the connection electrodes 20ce', 30ce', 40ce', and 50ce' of the light emitting chip 200, respectively.

The extension electrodes 11c' may be separated from each other and generally have a substantially elongated shape, however, the inventive concepts are not limited to one particular shape of the extension electrodes 11c'. The extension electrode 11c' according to an exemplary embodiment may include metal, such as Cu, Ni, Ti, Sb, Zn, Mo, Co, Sn, Ag, or an alloy thereof, without being limited thereto. For example, the extension electrode 11c' may include two or more metals or a plurality of different metal layers to reduce the stress applied thereto from the elongated shape thereof. In some exemplary embodiments, when the extension electrode 11c' includes Cu, an additional metal may be deposited or plated thereon to suppress oxidation of Cu. In some exemplary embodiments, when the extension electrode 11c' includes Cu/Ni/Sn, Cu may prevent Sn from being infiltrating into the light emitting stacked structure. The extension electrode 11c' may be formed by a metal plating process, without being limited thereto.

According to the illustrated exemplary embodiment, each of the extension electrodes 11c' may be formed near a distal end of the lead electrode 11pc' that faces away the light emitting chip 200. In this manner, the extension electrodes 11c' may structurally support the light emitting package 220, as the extension electrodes 11c' are formed near each corner of the light emitting package 220. In some exemplary embodiments, the extension electrodes 11c' may not overlap the connection electrodes 20ce', 30ce', 40ce', and 50ce' to enhance structural stability.

The second molding layer 92' may be disposed on the insulation layer 11p' and substantially surround the extension electrodes 11c'. The second molding layer 92' may include an organic or an inorganic polymer. In some exemplary embodiments, at least one of the first and second molding layer 91' and 92' may additionally include pillars, such as silica or alumina. In some exemplary embodiments, the second molding layer 92' may be formed through various methods known in the art, such as lamination, plating, and/or printing methods. For example, the second molding layer 92' may be formed by a vacuum laminate process, in which an organic polymer sheet is disposed on the light emitting chip 200, and high temperature and pressure are applied in vacuum, to improve light uniformity by providing a substantially planar top surface of the light emitting package. In this manner, the light emitting package 220 may provide a reinforced package structure.

Referring to FIG. 24, a light emitting package 230 according to yet another exemplary embodiment is substantially the same as the light emitting package 220 of FIG. 23, except that the first molding layer 91' is formed over the substrate 11 of the light emitting chip 200, to prevent external light from being reflected by the substrate 11 towards a direction that can be seen by a user. In this case, in some exemplary embodiments, a portion of the first molding layer 91' covering a top surface of the substrate 11 facing away the insulation layer 11p' may have a thickness less than about 100 µm to at least transmit 50% of light emitted from the light emitting chip 200.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting apparatus, comprising:
   a first LED sub-unit;
   a second LED sub-unit disposed on the first LED sub-unit;
   a third LED sub-unit disposed on the second LED sub-unit;
   a plurality of connection electrodes electrically connected to at least one of the first, second, and third LED sub-units, the connection electrodes covering a side surface of at least one of the first, second, and third LED sub-units;
   a first passivation layer surrounding side surfaces of at least one of the first, second, and third LED sub-units and including a region having a thickness greater than a thickness of each of the connection electrodes;
   an insulating layer having first and second opposed surfaces, with the first surface facing the LED sub-units; and
   a first electrode disposed on the first surface of the insulating layer and electrically connected to at least one of the connection electrodes,
   wherein a thickness of the first LED sub-unit is greater than that of the second LED sub-unit,
   wherein the thickness of the first LED sub-unit is greater than that of the third LED sub-unit, and
   wherein each of the first, second, and third LED sub-units is configured to be driven independently to emit light having different intensities.

2. The light emitting apparatus of claim 1, wherein the connection electrodes overlap at least one of the first, second, and third LED sub-units.

3. The light emitting apparatus of claim 1, further comprising a substrate on which the first LED sub-unit is disposed and through which light emitted from the first LED sub-unit is configured to pass,
   wherein the substrate is exposed by the first passivation layer.

4. The light emitting apparatus of claim 1, wherein the first passivation layer is disposed between the connection electrodes.

5. The light emitting apparatus of claim 1, wherein:
   the first electrode comprises a plurality of contact electrodes, each of which corresponds to one of the connection electrodes;
   the contact electrodes are spaced apart from each other at a first pitch; and
   the connection electrodes are spaced apart from each other at a second pitch, with the first pitch being greater than the second pitch.

6. The light emitting apparatus of claim 1, wherein:
the first LED sub-unit longitudinally extends along a first direction; and
the first electrode extends outwardly away from a distal end of the first LED sub-unit along the first direction.

7. The light emitting apparatus of claim 1, further comprising:
an auxiliary electrode disposed on the second surface of the insulating layer; and
a second passivation layer surrounding at least sides of the auxiliary electrode and being spaced apart from the first passivation layer.

8. The light emitting apparatus of claim 1, further comprising:
a substrate on which the first LED sub-unit is disposed, the substrate having a top surface and side surfaces;
an auxiliary electrode disposed on the second surface of the insulating layer; and
a second passivation layer surrounding at least sides of the auxiliary electrode,
wherein the first passivation layer covers the top surface and side surfaces of the substrate.

9. The light emitting apparatus of claim 1, further comprising a substrate on which the first LED sub-unit is disposed,
wherein:
the first LED sub-unit comprises a first LED light emitting stack;
the second LED sub-unit comprises a second LED light emitting stack;
the third LED sub-unit comprises a third LED light emitting stack;
the first, second, and third LED light emitting stacks have successively smaller regions overlapping with the substrate; and
at least one of the LED light emitting stacks comprises a micro-LED having a surface area less than about 10,000 square µm.

10. The light emitting apparatus of claim 1, wherein:
the first passivation layer comprises at least one of a black epoxy molding compound and a polyimide film; and
the first passivation layer covers an upper surface of the third LED sub-unit.

11. The light emitting apparatus of claim 1, further comprising a second passivation layer disposed between the third LED sub-unit and the connection electrodes,
wherein the insulating layer is disposed under the first, second, and third LED sub-units and contacts the connection electrodes.

12. The light emitting apparatus of claim 11, wherein at least one of the connection electrodes covers a portion of a side surface and a portion of a top surface of the second passivation layer.

13. The light emitting apparatus of claim 11, wherein the first passivation layer is disposed between the connection electrodes.

14. The light emitting apparatus of claim 12, wherein the first passivation layer contacts the second passivation layer between the connection electrodes.

15. The light emitting apparatus of claim 11, wherein the first passivation layer and the second passivation layer comprise the same material.

16. The light emitting apparatus of claim 11, wherein:
the first electrode comprises a plurality of contact electrodes, each of which corresponds to one of the connection electrodes;
the contact electrodes are spaced apart from each other at a first pitch; and
the connection electrodes are spaced apart from each other at a second pitch, with the first pitch being greater than the second pitch.

17. The light emitting apparatus of claim 11, further comprising a substrate on which the first LED sub-unit is disposed,
wherein an angle defined between a side surface of the second passivation layer and a top surface of the substrate is less than about 80°.

18. The light emitting apparatus of claim 17, wherein the first passivation layer exposes a top surface of the substrate.

19. The light emitting apparatus of claim 11, further comprising:
an auxiliary electrode having top and side surfaces formed on the second surface of the insulating layer; and
a third passivation layer surrounding at least the top and side surfaces of the auxiliary electrode and spaced apart from the first passivation layer and the second passivation layer.

20. The light emitting apparatus of claim 11, further comprising:
a substrate on which the first LED sub-unit is disposed, the substrate having a top surface and side surfaces;
an auxiliary electrode disposed on the second surface of the insulating layer; and
a third passivation layer substantially surrounding the auxiliary electrode,
wherein the first passivation layer covers at least a portion of the top surface and a portion of side surfaces of the substrate.

* * * * *